United States Patent
Brown et al.

(10) Patent No.: US 11,012,953 B2
(45) Date of Patent: May 18, 2021

(54) FREQUENCY SELECTIVE LOGARITHMIC AMPLIFIER WITH INTRINSIC FREQUENCY DEMODULATION CAPABILITY

(71) Applicant: DOCKON AG, Zurich (CH)

(72) Inventors: Forrest James Brown, San Diego, CA (US); Patrick Antoine Rada, San Diego, CA (US); Alexandre Dupuy, San Diego, CA (US)

( * ) Notice: Subject to any disclaimer, the term of this patent is extended or adjusted under 35 U.S.C. 154(b) by 0 days.

(21) Appl. No.: 15/493,617

(22) Filed: Apr. 21, 2017

(65) Prior Publication Data

US 2017/0222603 A1    Aug. 3, 2017

Related U.S. Application Data

(62) Division of application No. 14/213,972, filed on Mar. 14, 2014, now Pat. No. 9,684,807.

(Continued)

(51) Int. Cl.
*H04W 52/52* (2009.01)
*H03D 1/18* (2006.01)
(Continued)

(52) U.S. Cl.
CPC .............. *H04W 52/52* (2013.01); *G06G 7/24* (2013.01); *H03D 1/18* (2013.01); *H03D 3/00* (2013.01);
(Continued)

(58) Field of Classification Search
CPC ........... H04W 52/52; G06G 7/24; H03D 1/18; H03D 3/00; H03D 11/04; H03D 11/08; H04B 1/26
(Continued)

(56) References Cited

U.S. PATENT DOCUMENTS 2,363,651 A   11/1944  Crosby
2,644,081 A    6/1953  Donald
(Continued)

FOREIGN PATENT DOCUMENTS

CN   101897117 A   11/2010
CN   102195660 A    9/2011
(Continued)

OTHER PUBLICATIONS

U.S. Appl. No. 14/216,945, filed Mar. 17, 2014, Rada et al.
(Continued)

*Primary Examiner* — Jinsong Hu
*Assistant Examiner* — Rui M Hu
(74) *Attorney, Agent, or Firm* — Cooley LLP

(57) ABSTRACT

A regenerative selective logarithmic detector amplifier (LDA) can have integrated FM demodulation capabilities. It can receive a wired or wireless FM modulated signal and amplify or demodulate it with high sensitivity, high skirt ratio and minimized noise when compared to the prior art. When used in conjunction with other circuits such as a PLL or mixer, it can improve interference rejection and frequency selectivity and be locked on a precise channel in frequency and phase. The LDA produces intermittent oscillations that are self-quenched when reaching a given threshold. It also embeds the circuitry to perform direct FM discrimination. FM demodulation process is completed by a simple analog or digital frequency to voltage converter. This plus the fact that the instantaneous regeneration gain is low-medium permit to detect signals of small amplitudes buried in the noise.

21 Claims, 32 Drawing Sheets

Related U.S. Application Data

(60) Provisional application No. 61/789,829, filed on Mar. 15, 2013.

(51) Int. Cl.
  *H03D 3/00* (2006.01)
  *H03D 11/04* (2006.01)
  *G06G 7/24* (2006.01)
  *H03D 11/08* (2006.01)
  *H04B 1/26* (2006.01)
  *H04L 7/033* (2006.01)
  *H04L 27/14* (2006.01)

(52) U.S. Cl.
  CPC ............. *H03D 11/04* (2013.01); *H03D 11/08* (2013.01); *H04B 1/26* (2013.01); *H04L 7/033* (2013.01); *H04L 27/14* (2013.01); *H03D 2200/006* (2013.01)

(58) Field of Classification Search
  USPC ........................................ 455/334–343.6, 209
  See application file for complete search history.

(56) References Cited

U.S. PATENT DOCUMENTS

| | | | |
|---|---|---|---|
| 3,092,779 A | | 6/1963 | De Niet |
| 3,199,031 A | | 8/1965 | Harris et al. |
| 3,320,530 A | | 5/1967 | Pearman |
| 3,337,807 A | | 8/1967 | Brown |
| 3,602,819 A | * | 8/1971 | Abbott .................. G01R 29/26 455/226.3 |
| 3,668,535 A | | 6/1972 | Lansdowne |
| 3,724,954 A | | 4/1973 | Dreyfoos |
| 3,791,272 A | | 2/1974 | Nobusawa |
| 3,965,426 A | * | 6/1976 | Ringland ................ H04B 1/18 455/143 |
| 4,034,298 A | * | 7/1977 | McFadyen ............. H03D 5/00 455/192.2 |
| 4,042,883 A | * | 8/1977 | Rae ........................ H03G 3/345 455/307 |
| 4,160,953 A | | 7/1979 | Matsuura et al. |
| 4,225,834 A | * | 9/1980 | van Doorn ............. H04B 3/141 29/600 |
| 4,393,514 A | | 7/1983 | Minakuchi et al. |
| 4,510,624 A | | 4/1985 | Thompson et al. |
| 4,577,503 A | | 3/1986 | Imaino et al. |
| 4,579,005 A | | 4/1986 | Brown |
| 4,609,994 A | | 9/1986 | Bassim et al. |
| 4,660,192 A | * | 4/1987 | Pomatto, Sr. ............ H04J 9/00 370/204 |
| 4,882,768 A | * | 11/1989 | Obana .................. H04B 1/1027 455/207 |
| 4,972,512 A | * | 11/1990 | Garskamp ............... H03D 1/00 455/341 |
| 4,979,186 A | * | 12/1990 | Fullerton ................ H01Q 9/28 375/239 |
| 1,424,065 A | | 7/1992 | Armstrong |
| 5,170,500 A | * | 12/1992 | Broderick ........... H03H 9/6433 333/194 |
| 5,479,442 A | * | 12/1995 | Yamamoto ............. H04B 1/707 375/150 |
| 5,621,756 A | | 4/1997 | Bush et al. |
| 5,742,897 A | * | 4/1998 | Plowdrey ............... H04B 1/005 370/297 |
| 5,771,026 A | * | 6/1998 | Stengel, Jr. ............. H01Q 1/32 343/715 |
| 5,789,996 A | | 8/1998 | Borodulin |
| 5,818,875 A | * | 10/1998 | Suzuki ..................... H04L 1/06 375/261 |
| 5,847,663 A | * | 12/1998 | Chasek ........... G08G 1/096741 340/905 |
| 5,995,814 A | * | 11/1999 | Yeh ........................ H03F 3/191 455/180.1 |
| 6,035,002 A | | 3/2000 | Schleifer |
| 6,054,900 A | | 4/2000 | Ishida et al. |
| 6,148,048 A | * | 11/2000 | Kerth .................... H04B 1/0007 341/139 |
| 6,389,275 B1 | | 5/2002 | Kawashima et al. |
| 6,420,937 B1 | | 7/2002 | Akatsuka et al. |
| 6,421,535 B1 | | 7/2002 | Dickerson et al. |
| 6,518,856 B1 | | 2/2003 | Casale et al. |
| 6,538,528 B2 | | 3/2003 | Louzir et al. |
| 6,574,287 B1 | | 6/2003 | Swaminathan et al. |
| 6,668,165 B1 | | 12/2003 | Cloutier |
| 6,668,619 B2 | | 12/2003 | Yang et al. |
| 6,670,849 B1 | | 12/2003 | Damgaard |
| 6,671,331 B1 | | 12/2003 | Sakuma |
| 6,684,058 B1 | * | 1/2004 | Karacaoglu .......... H04B 7/2606 455/17 |
| 7,215,936 B2 | | 5/2007 | Sadowski |
| 7,289,784 B2 | * | 10/2007 | Nam ...................... H03H 11/04 330/292 |
| 7,400,904 B2 | * | 7/2008 | Cornwall ............. H04L 27/0012 375/334 |
| 7,423,931 B2 | | 9/2008 | Martin et al. |
| 7,567,099 B2 | | 7/2009 | Edwards et al. |
| 7,567,527 B2 | * | 7/2009 | Perlman ............... H04L 63/0428 370/315 |
| 7,612,616 B2 | | 11/2009 | Deng |
| 7,683,694 B2 | | 3/2010 | Gehring |
| 7,751,857 B2 | * | 7/2010 | Beumer .................. H03F 3/191 455/572 |
| 7,751,996 B1 | | 7/2010 | Ardizzone et al. |
| 7,819,022 B2 | | 10/2010 | Hope |
| 7,848,384 B2 | | 12/2010 | Pelissier et al. |
| 7,911,235 B2 | | 3/2011 | Brown |
| 8,040,204 B2 | | 10/2011 | Brown |
| 8,064,864 B2 | | 11/2011 | Rofougaran |
| 8,144,065 B2 | | 3/2012 | Brown |
| 8,149,173 B2 | | 4/2012 | Brown |
| 8,164,532 B1 | | 4/2012 | Brown |
| 8,265,769 B2 | | 9/2012 | Denison |
| 8,326,340 B2 | | 12/2012 | Nalbantis et al. |
| 8,364,098 B2 | | 1/2013 | Ridgers |
| 8,368,485 B2 | | 2/2013 | Brown |
| 8,385,910 B2 | | 2/2013 | Nazrul et al. |
| 8,462,031 B2 | | 6/2013 | Belot et al. |
| 8,542,768 B2 | | 9/2013 | Kim et al. |
| 8,644,776 B1 | | 2/2014 | Nobbe et al. |
| 8,649,739 B2 | * | 2/2014 | Gorbachov ............. H04B 1/18 455/83 |
| 8,655,441 B2 | | 2/2014 | Fletcher et al. |
| 8,676,521 B2 | | 3/2014 | Vennelakanti et al. |
| 8,724,731 B2 | | 5/2014 | Steffen |
| 9,590,572 B2 | | 3/2017 | Rada et al. |
| 9,684,807 B2 | | 6/2017 | Brown et al. |
| 9,755,580 B2 | * | 9/2017 | Desclos .................. H03F 1/42 |
| 2001/0037676 A1 | | 11/2001 | Chang |
| 2002/0109607 A1 | | 8/2002 | Cumeral et al. |
| 2002/0111151 A1 | * | 8/2002 | Irion ...................... H04H 40/90 455/325 |
| 2004/0036554 A1 | * | 2/2004 | Veyres .................. H03H 7/0115 333/167 |
| 2004/0119099 A1 | * | 6/2004 | Tomita ..................... H03J 3/08 257/202 |
| 2004/0153879 A1 | * | 8/2004 | Fukutani ................ H04L 27/22 714/48 |
| 2004/0157550 A1 | * | 8/2004 | Nakagawa ......... H04B 7/15564 455/7 |
| 2004/0198288 A1 | * | 10/2004 | Sadowski ............. H03D 11/02 455/259 |
| 2004/0229585 A1 | | 11/2004 | Lu et al. |
| 2004/0240588 A1 | | 12/2004 | Miller |
| 2005/0003785 A1 | | 1/2005 | Jackson et al. |
| 2005/0009480 A1 | | 1/2005 | Vakilian et al. |
| 2005/0069051 A1 | | 3/2005 | Lourens |
| 2005/0270172 A1 | | 12/2005 | Bailey et al. |
| 2006/0028297 A1 | | 2/2006 | Kang et al. |
| 2006/0226897 A1 | * | 10/2006 | De Ruijter ............. H03D 3/007 329/315 |

(56) References Cited

U.S. PATENT DOCUMENTS

| | | |
|---|---|---|
| 2007/0030099 A1* | 2/2007 | Carpentier ............... H03H 9/58 333/189 |
| 2007/0042734 A1* | 2/2007 | Ryu ....................... H04B 1/005 455/182.3 |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0101185 A1 | 5/2008 | Rozenblit et al. |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0160578 A1* | 6/2009 | Achour ................... H01P 1/213 333/175 |
| 2009/0270063 A1* | 10/2009 | Tuttle ...................... H04B 1/30 455/333 |
| 2009/0322544 A1 | 12/2009 | McDowell |
| 2010/0080270 A1 | 4/2010 | Chen et al. |
| 2010/0152644 A1 | 6/2010 | Pesach et al. |
| 2010/0225417 A1 | 9/2010 | Mistretta et al. |
| 2010/0237935 A1* | 9/2010 | Brown ..................... H03D 1/18 329/305 |
| 2010/0308999 A1 | 12/2010 | Chornenky |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0117834 A1* | 5/2011 | Martin ................. H04B 7/2606 455/7 |
| 2011/0143685 A1* | 6/2011 | Cebi ....................... H03F 1/34 455/73 |
| 2011/0212692 A1* | 9/2011 | Hahn ...................... H04B 1/52 455/63.1 |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0021713 A1* | 1/2012 | Mikhemar ............... H04B 1/18 455/341 |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2012/0314811 A1* | 12/2012 | Goldfarb ............... H03D 7/1441 375/316 |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2013/0222058 A1* | 8/2013 | Maniwa ................... H03F 1/56 330/144 |
| 2013/0295863 A1* | 11/2013 | Shanan ............... H03F 3/45179 455/226.2 |
| 2014/0141738 A1* | 5/2014 | Janesch .................. H04B 1/18 455/192.2 |
| 2014/0150554 A1 | 6/2014 | Rada et al. |
| 2014/0154991 A1 | 6/2014 | Brown et al. |
| 2014/0171002 A1 | 6/2014 | Park et al. |
| 2014/0266420 A1 | 9/2014 | Brown et al. |
| 2014/0269972 A1 | 9/2014 | Rada et al. |
| 2014/0273898 A1* | 9/2014 | Brown ................... H03D 11/04 455/142 |
| 2014/0287704 A1 | 9/2014 | Dupuy et al. |
| 2015/0070093 A1 | 3/2015 | Rada et al. |
| 2017/0238269 A1 | 8/2017 | Brown et al. |

FOREIGN PATENT DOCUMENTS

| | | |
|---|---|---|
| EP | 0283401 A2 | 9/1988 |
| EP | 1384281 A2 | 1/2004 |
| GB | 648920 A | 1/1951 |
| GB | 2354329 A | 3/2001 |
| JP | 56-138340 A | 10/1981 |
| JP | 56-138342 A | 10/1981 |
| JP | S 60-249436 A | 12/1985 |
| JP | 10-075273 A | 3/1998 |
| JP | H10-290122 A | 10/1998 |
| WO | WO 2000/035124 A2 | 6/2000 |
| WO | WO 2002/084782 A2 | 10/2002 |
| WO | WO 2008/018836 A1 | 2/2008 |
| WO | WO 2008/075066 A2 | 6/2008 |
| WO | WO 2012/153147 A1 | 11/2012 |

OTHER PUBLICATIONS

Sanders B.J.; "Radical Combiner Runs Circles Around Hybrids," MicroWaves; Nov. 1980; vol. 19, No. 12; p. 55-58.

Caloz et al.;"Metamaterials for High-Frequency Electronics"; Proceedings of the IEEE; vol. 93; No. 10; Oct. 2005; p. 1744-1752.

Insam; "Designing Super-Regenerative Receivers"; Electronic World; Apr. 2002; 19 pages.

International Patent Application No. PCT/US2014/029832; Int'l Preliminary Report on Patentability; dated Mar. 11, 2015; 7 pages.

International Patent Application No. PCT/US2014/029577; Int'l Preliminary Report on Patentability; dated Jun. 19, 2015; 17 pages.

European Patent Application No. 13860466.5; Extended Search Report; dated Jul. 27, 2016; 7 pages.

European Patent Application No. 13859934.5; Extended Search Report; dated Jul. 27, 2016; 9 pages.

European Patent Application No. 14764728.3; Extended Search Report; dated Mar. 3, 2017; 13 pages.

European Patent Application No. 14844032.4; Extended Search Report; dated Apr. 5, 2017; 12 pages.

* cited by examiner

FREQUENCY SELECTIVE LOGARITHMIC AMPLIFIER WITH INTRINSIC FREQUENCY DEMODULATION CAPABILITY

CROSS REFERENCE TO RELATED APPLICATIONS

This application is a divisional of U.S. patent application Ser. No. 14/213,972, filed Mar. 14, 2014, which claims the benefit of U.S. Provisional Application 61/789,829, filed Mar. 15, 2013, the contents of which are hereby incorporated by reference in their entirety.

TECHNICAL FIELD

The subject matter disclosed herein relates to a regenerative selective logarithmic detector amplifier (LDA) with integrated FM demodulation capabilities. It can receive a wired or wireless FM modulated signal and amplify or demodulate it with high sensitivity, high skirt ratio and minimized noise when compared to the prior art. When used in conjunction with other circuits such as a phase lock loop (PLL) or mixer, it can improve interference rejection and frequency selectivity and be locked on a precise channel in frequency and phase. The LDA produces intermittent oscillations that are self-quenched when reaching a given threshold. It also embeds the circuitry to perform direct FM discrimination. This plus the fact that the instantaneous regeneration gain is low-medium permit to detect signals of small amplitudes buried in the noise. The LDA converts an analog or digital FM, AM, or FM & AM modulated signal and produces a train of almost constant amplitude and quasi-digital pulses in an intermediate frequency over a wide dynamic range. A digital frequency to voltage converter (VFC) may be used to convert the pulse frequency in a digital voltage word with simple processing. Alternatively a simple analog VFC or peak detector can be used to demodulate the input signal to baseband with audio or video bandwidth. Innovation factors include direct FM demodulation, high sensitivity and signal regeneration from noise level, high skirt ratio and quasi digital output data without the need of AFC.

BACKGROUND

Regenerative selective logarithmic detector amplifiers (LDAs) disclosed herein have similarities to super-regenerative receivers (SRO) in term of circuit topology. However, the LDA is a phase sensitive regeneration detector, while the SRO is an amplitude sensitivity regeneration device. In particular, the LDA has a self-quenching mechanism with low gain that amplifies the signal from the noise floor over a number of cycles. In contrast, the SRO has external quenching and high gain that makes its electrical behaviors and performances quite different. There are also some similarities between the LDA and DC or baseband log amps: both provide logarithmic amplification over a wide dynamic range. Furthermore, the LDA can have an intrinsic capability to demodulate analog or digital FM or AM & FM simultaneously. Examples of LDAs can be found in U.S. Pat. No. 7,911,235, issued to DockOn AG, the contents of which are hereby incorporated by reference in their entirety.

The SRO typically suffers from poor selectivity and higher output noise when used for narrow band signals. SROs also may drift in temperature when the oscillator is LC based. The SRO receiver was quickly replaced by the super-heterodyne receiver for mainstream radio, because the latter has superior selectivity and sensitivity. However, the SRO is simple and low power, and has been used over many decades for remote control systems, short distance telemetry, and wireless security. Selectivity and drift limitations were addressed at the end of the 1980s by the use of SAW devices. In the first decade of the 21st century, articles show a renewed interest in SROs for use in low power receivers up to the GHz range, and for moderate to high data rate applications.

Baseband log amps are based on multiple Gilbert cells, and typically provide a good linearity over a mid to large dynamic range at low to high frequencies. Simpler logarithmic amplifiers (e.g. DC log amps) are based on transistor logarithmic current versus voltage transfer characteristic, and address applications ranging from DC to low frequency.

BRIEF DESCRIPTION OF THE DRAWINGS

Throughout the drawings, reference numbers may be re-used to indicate correspondence between referenced elements. The drawings are provided to illustrate examples described herein and are not intended to limit the scope of the disclosure.

crimination, and flexible placement in a receiver chain without drawback. Table 1 compares various LDA, SRO, and amp technologies with their respective pros and cons.

TABLE 1

Comparison of LDA, SRO, and amp technologies

| Parameters | LDAs | SROs | DC or baseband Log amps |
|---|---|---|---|
| Receive sensitivity @ 1 MHz bandwidth | Very high, on the order of −114 dBm | Medium to high, on the order of −80 dBm to −90 dBm | Medium to high, on the order of −80 dBm to −90 dBm |
| Dynamic range (min. to max. signal level range) | Very high, on the order of 100 dB | Medium, In the order of 20 to 60 dB | High, In the order of 40 to 90 dB |
| Ability to directly demodulate FM | Yes FM, AM & both FM/AM incl. digital modulations | No AM only | No |
| Demodulation discrimination (FM) | Superior, high skirt ratio Up to 4 dB higher than standard discriminators | None | None |
| Reduce Noise | Yes | No | No |
| Noise | Bandwidth dependent, typ. equal to noise power | Maximum noise, min. 6 dB above noise floor to be usable | Maximum noise minus 10 dB, min. 6 dB above noise floor to be usable |
| Placement in receive chain | ANYWHERE without loss of receive sensitivity | ANYWHERE with loss of receive sensitivity (except if upfront) | N.A. |
| Quenching process | Self-quenched leading to very high sensitivity | Externally quenched (or synchronized) | N.A. |
| Amplification mode | Phase sensitive regeneration | Amplitude sensitive regeneration | multiple amplification |
| Circuit topology | Proprietary | Generally Colpitt oscillator-based | Typically multi-stage Gilbert cells |
| Gain | Low | High | High - very high on the order of 30-70 dB |

Figure 21:
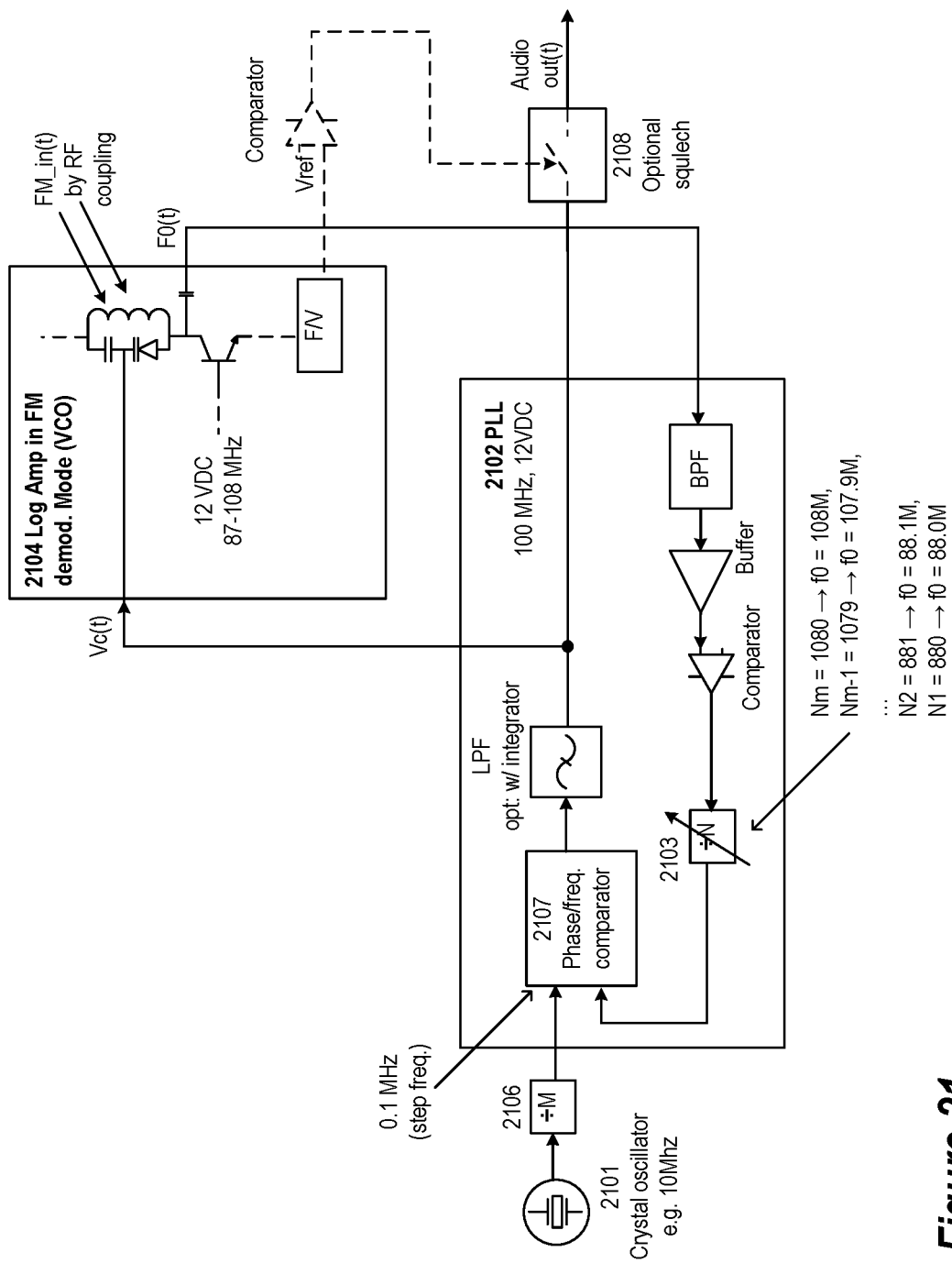

FIG. 21 depicts an embodiment of LDA-pulsed oscillator locked in frequency in a phase lock loop (PLL) to a precise reference frequency tuned to the desired FM radio channel where the antenna is integral of the resonant circuit of the LDA and radiowaves are coupled directly to the inductive part of the resonant circuit.

Figure 22:
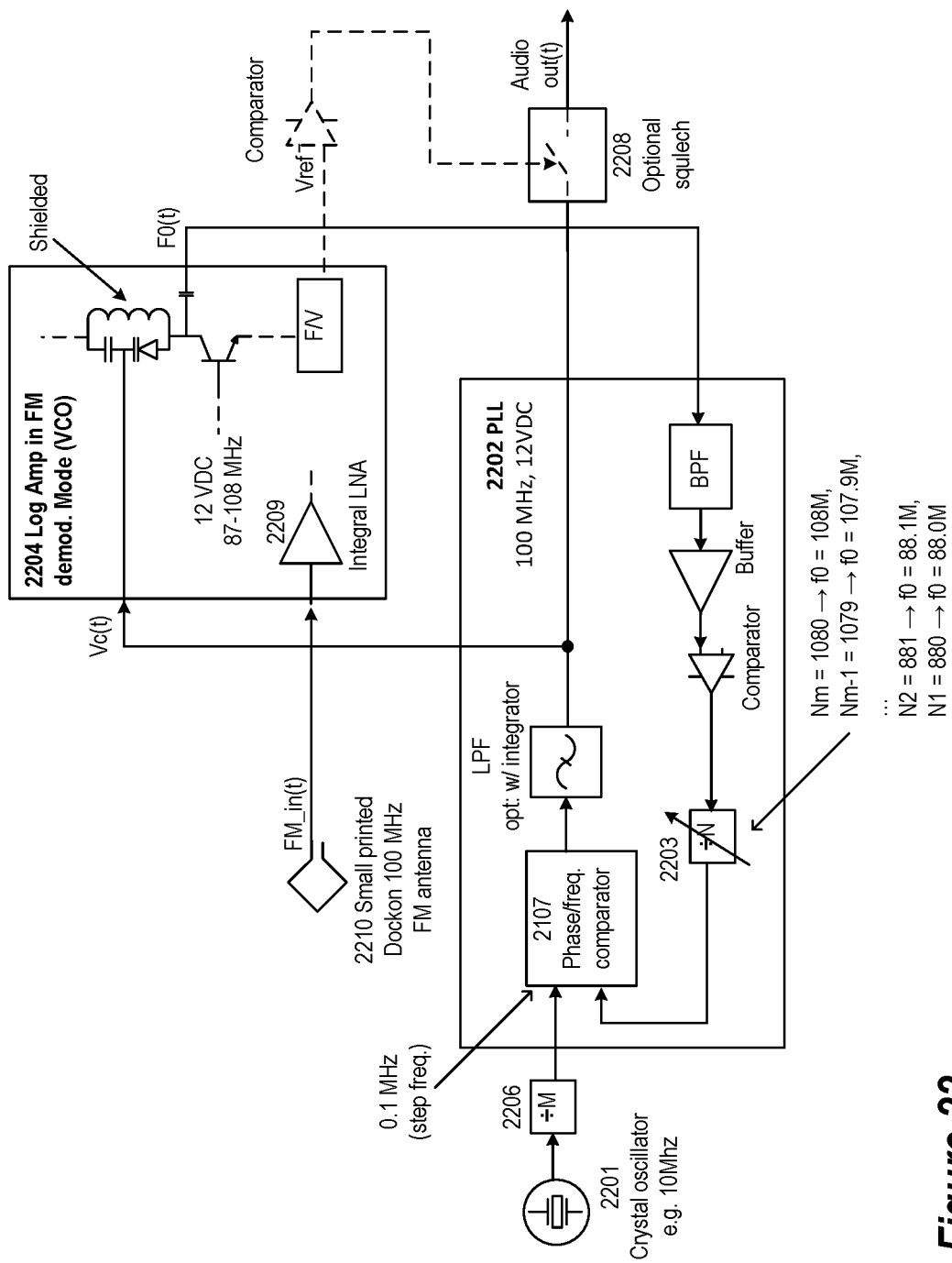

FIG. 22 depicts an embodiment of an LDA based FM radio receiver (FM-LDA) with digital channel tuning with a CPL antenna connected to the input RF_IN.

Figure 23:
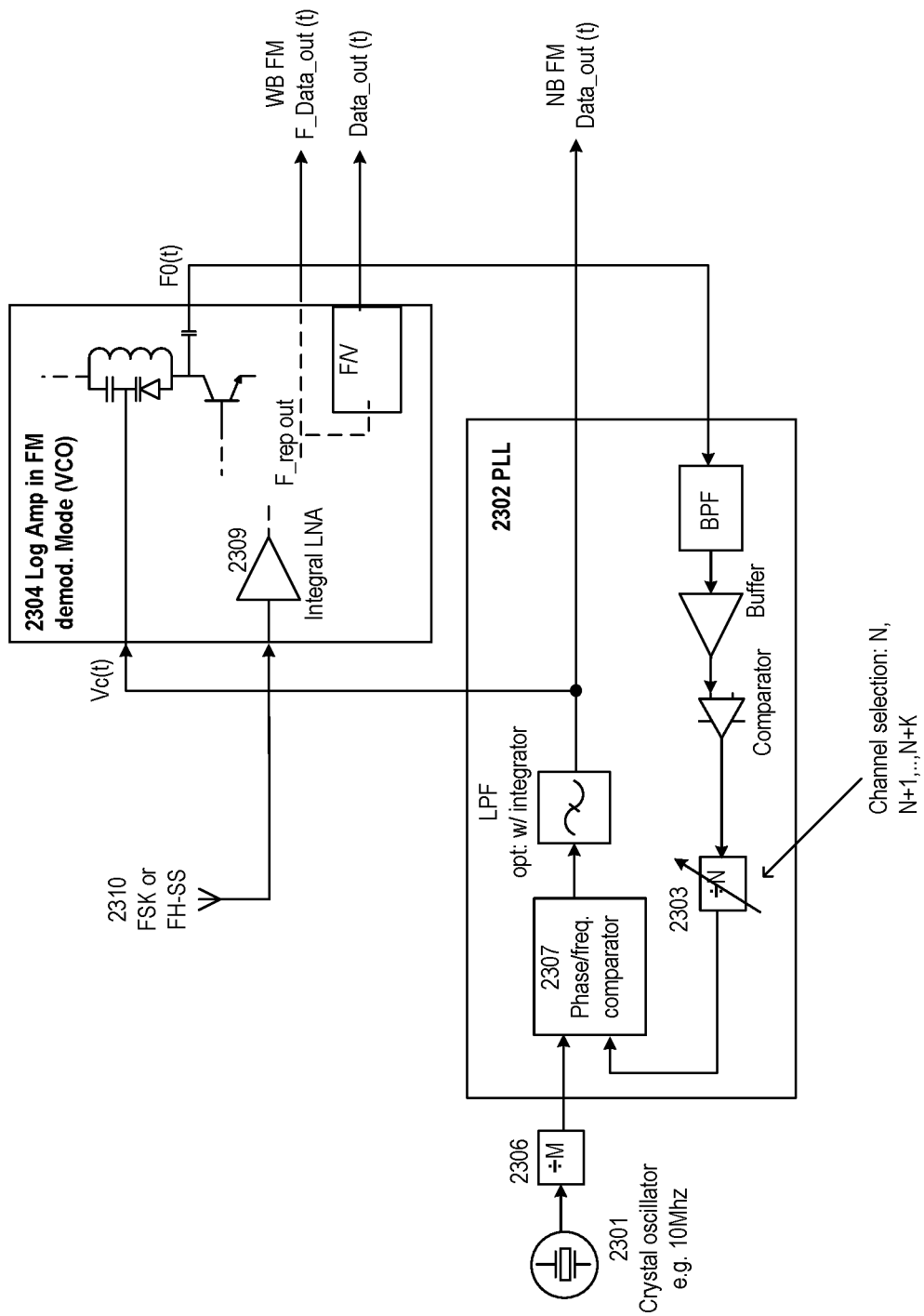

FIG. 23 depicts a high-sensitivity, low-noise amplifier replacement based on FM-LDA and PLL for FSK or FH-SS modulations with an antenna connected to the RF_IN input.

Figure 24A:
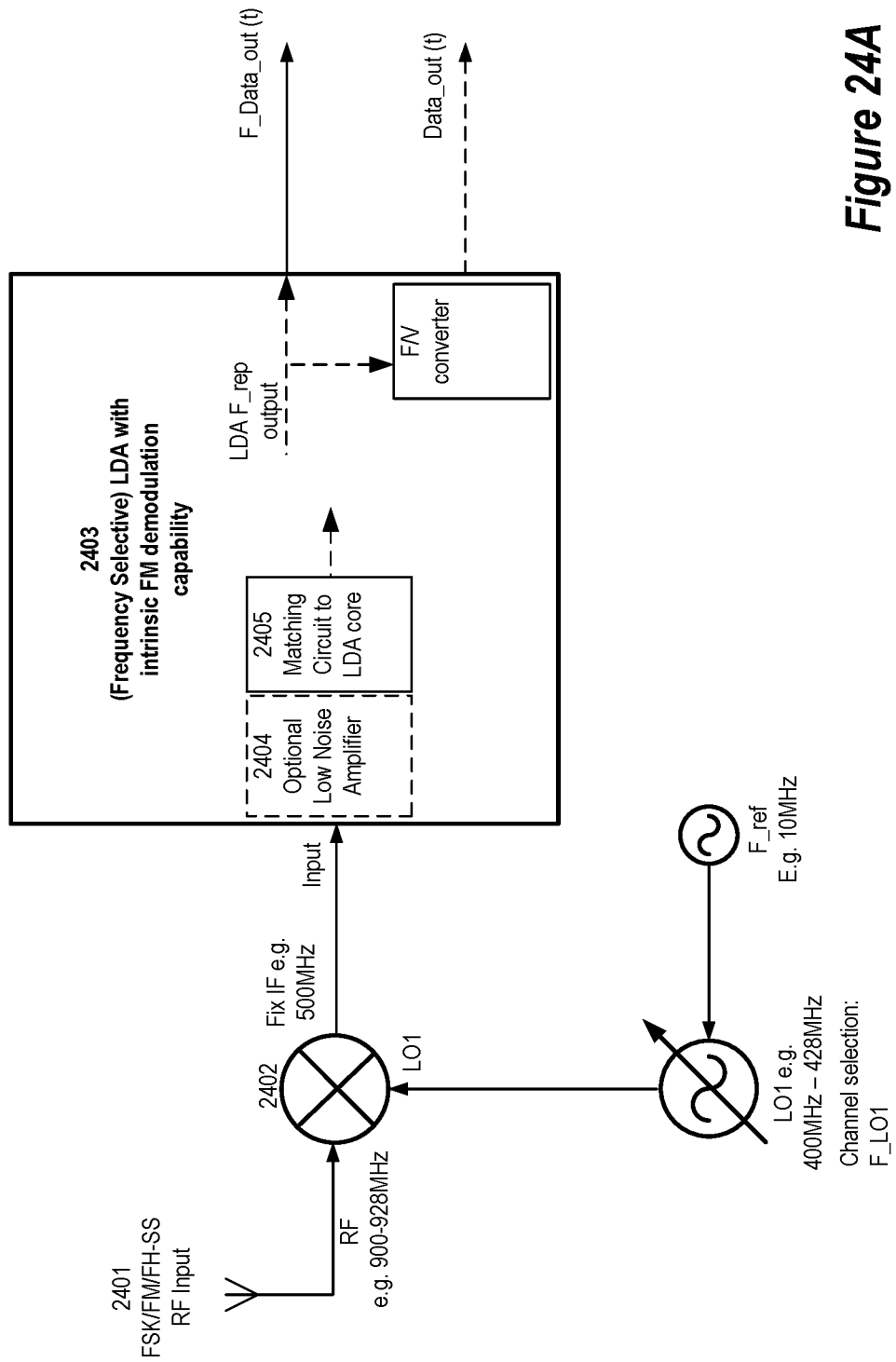

FIG. 24A depicts an embodiment of a high-sensitivity, low-noise amplifier based on FM-LDA for FSK or FH-SS modulations with super-heterodyne topology.

Figure 24B:
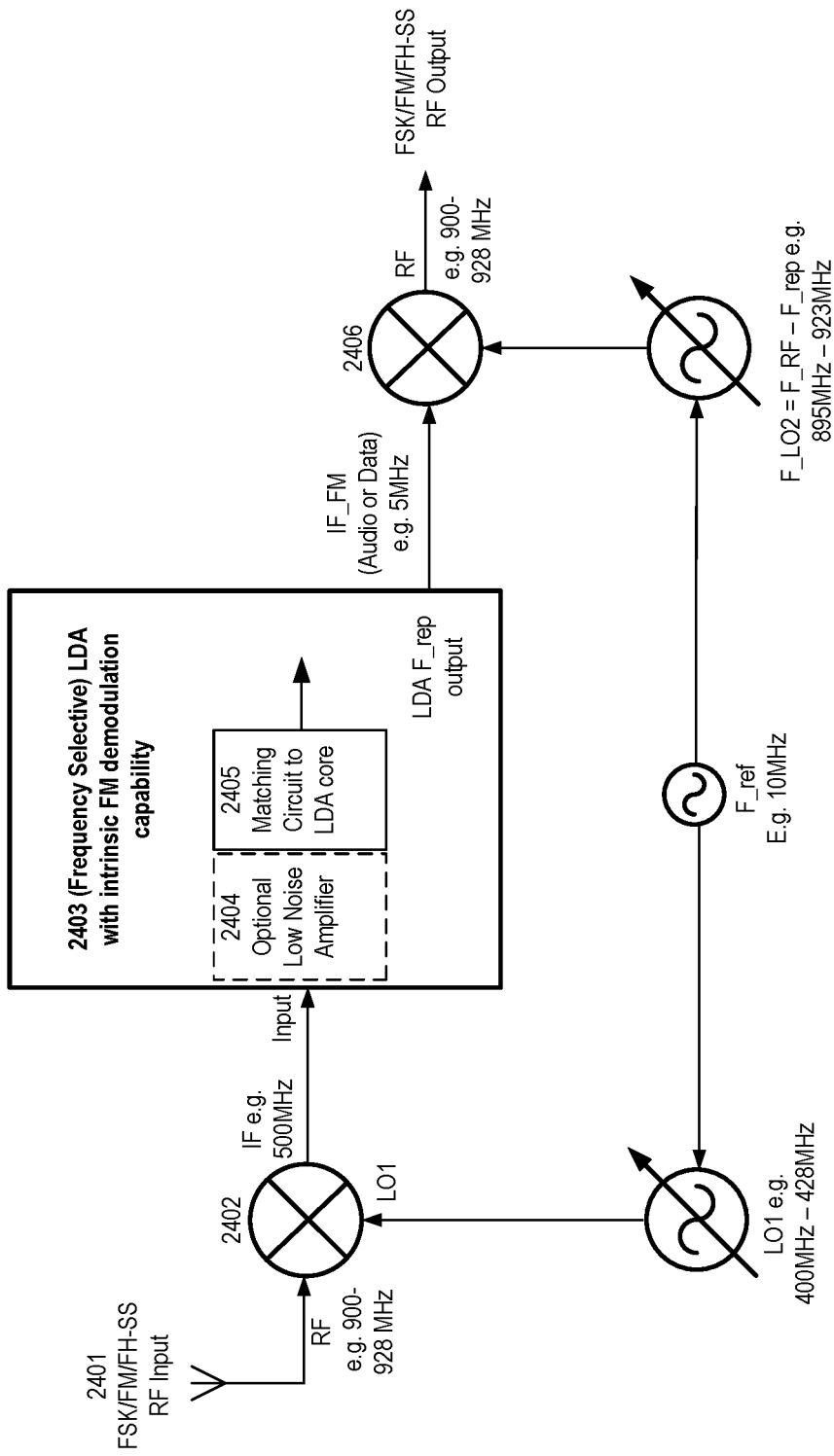

FIG. 24B depicts an embodiment of a LNA replacement for a FSK Receiver based on FM LDA and super heterodyne reception.

Figure 25:
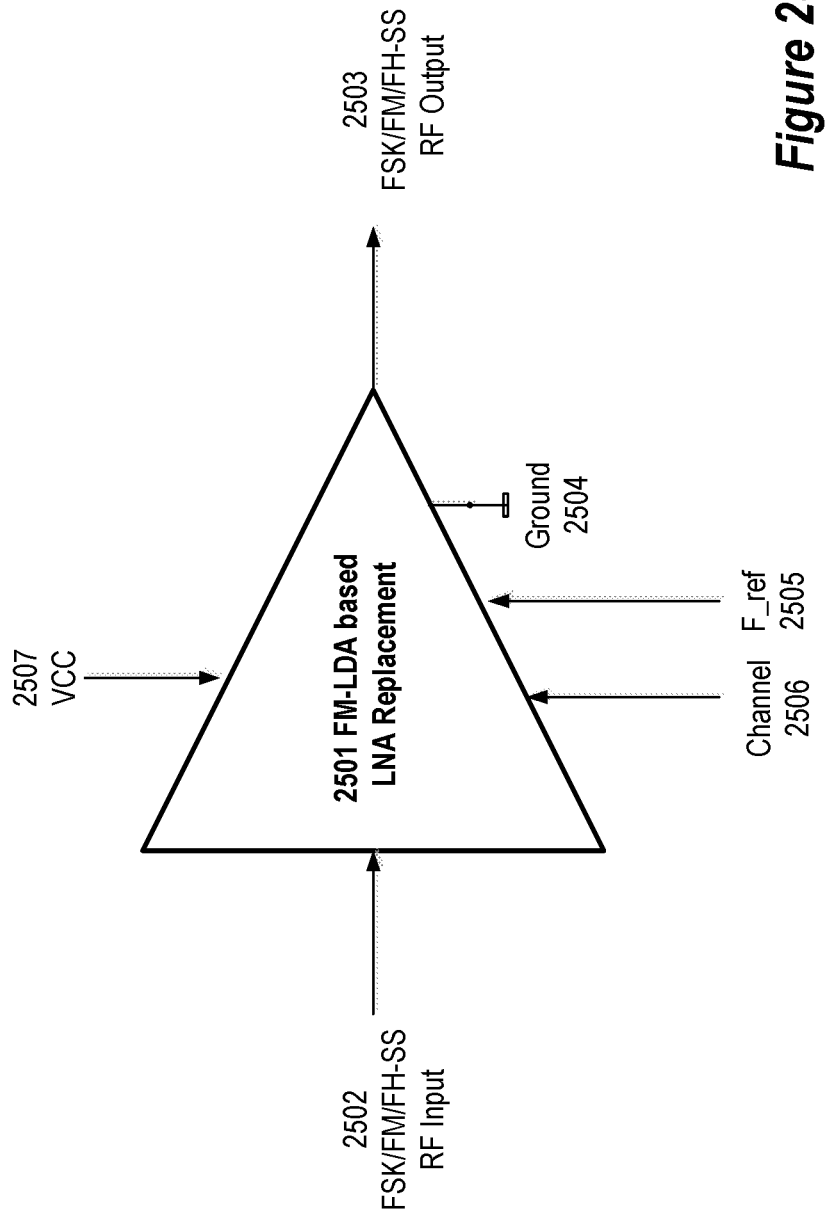

FIG. 25 depicts an example of a FM-LDA LNA replacement.

Figure 26:
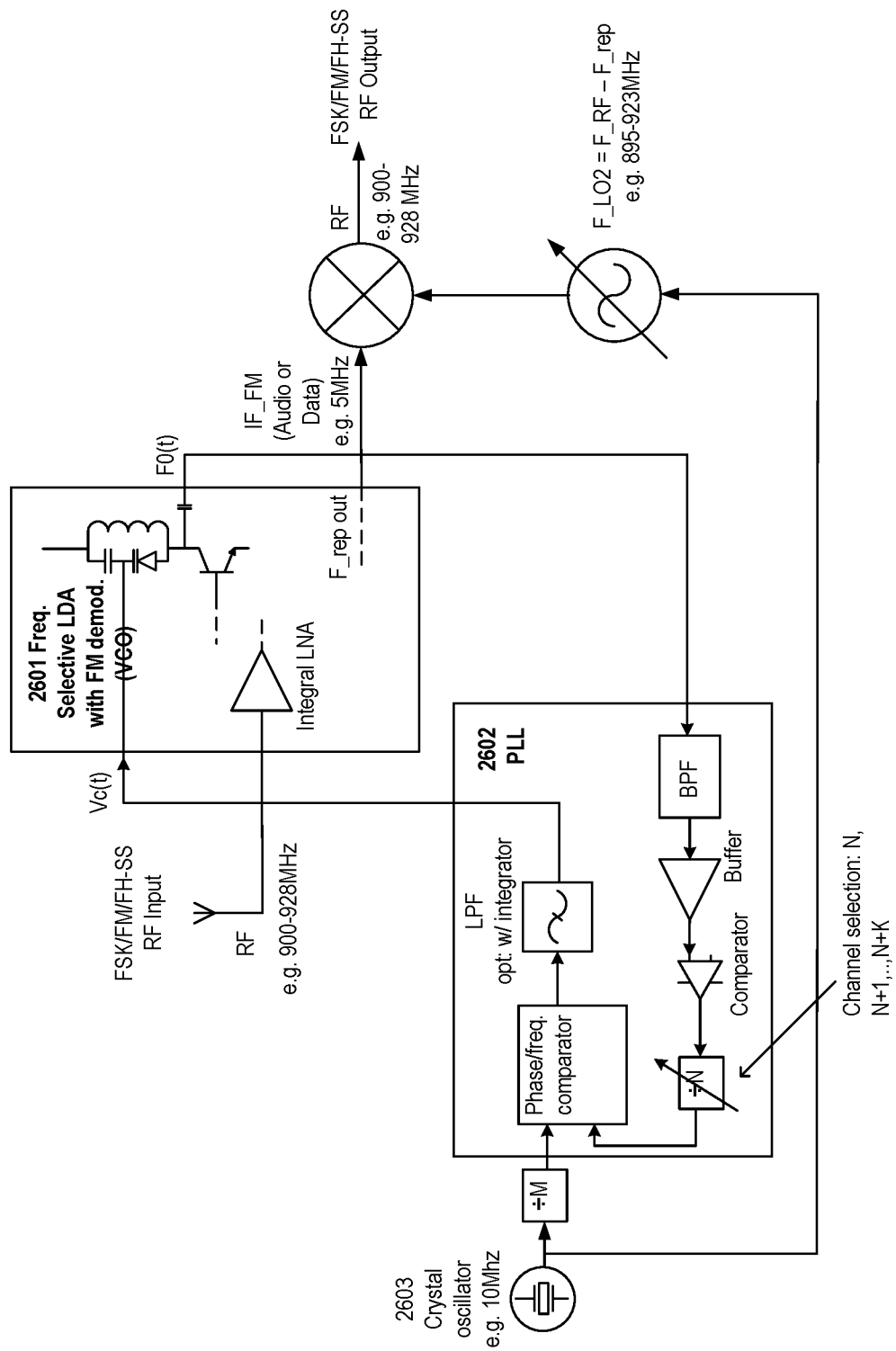

FIG. 26 depicts another embodiment of an LNA replacement for an FSK receiver based on LDA in FM mode and PLL.

Figure 27:
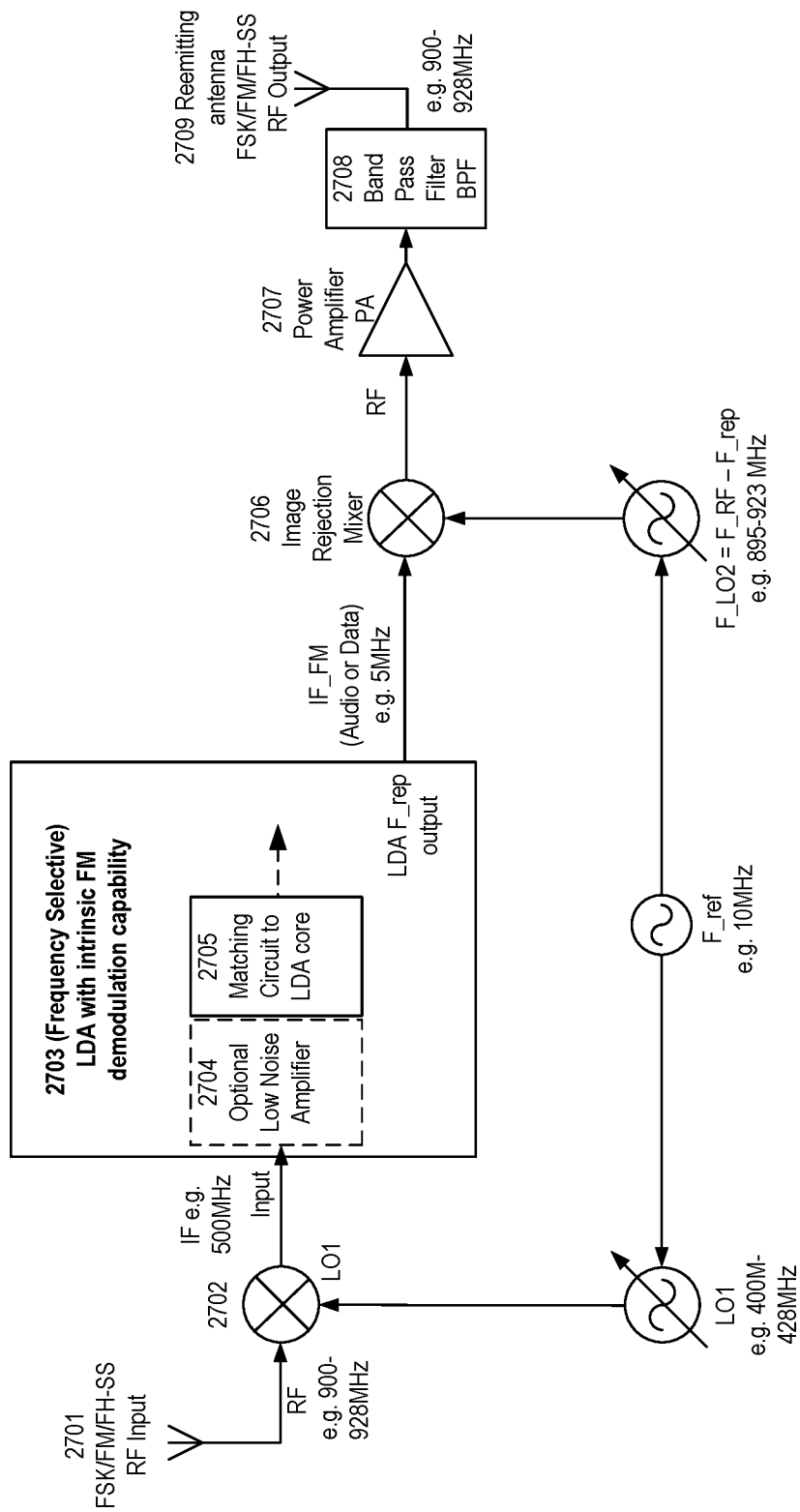

FIG. 27 depicts an embodiment of a FM-LDA based FSK repeater. The implementation of such wireless repeater is similar to the LNA replacement.

DETAILED DESCRIPTION

The LDA technology described herein brings significant enhancements to the state of the art SROs and log amps. For examples, LDAs can have intrinsic ability to demodulate frequency with high skirt ratio, very high sensitivity and noise suppression, very high dynamic range, superior dis- The following other methods may be envisioned to process a weak signal buried into the noise: averaging, selective amplification, filtering, synchronized detection, spread spectrum and nonlinear RAMAN optic amplifier:

Averaging: Noise is reduced over n periods; however the signal is NOT amplified. Also the averaging needs an accurate trigger for reference, and this trigger that may be noisy and problematic at low signal levels.

Selective amplification and/or filtering: Amplification and or filtering are frequency dependent and stationary, so they do not provide any improvement over time in the frequency pass band, nor reduce the noise in that pass band. This is problematic if the bandwidth is large. Also, selective amplifiers have a limited noise rejection.

Synchronized detection: uses a phase lock loop (PLL) to lock it to the input signal, which selectivity implies a narrow band unless more complicated methods are used, and may also be problematic at very low signal levels.

Direct Sequence Spread Spectrum (DS-SS): Bits are spread over a wide frequency spectrum during the transmitting modulation process, eventually communicated over a lossy medium. The receiver dispreads energy and makes the demodulated signal appear much above the noise floor (e.g. GPS with a typical spreading factor of one thousand). By this means, very high attenuation can be overcome. Of course at the end this method can use a DS-SS transmitter that is not practical for many applications.

RAMAN distributed optic amplifier: With such devices, the SNR can be improved and transport of data on fiber optic on hundreds or thousands of kilometers possible with minimum regeneration.

The LDA technology described herein concerns a regenerative logarithmic detector amplifier (LDA) with integrated FM demodulation (FM-LDA) that can receive wired or wireless FM, AM, or FM & AM signals with increased sensitivity, interference rejection, and bandwidth relative to circuits in current use. The LDA can also amplify signals while minimizing noise.

The FM-LDA achieves these goals with integral hardware that improves the signal-to-noise ratio SNR of an AM or FM input signal by restarting its cycle automatically, and without external means, whenever the input signal reaches a specific amplitude over time (threshold). The LDA circuit thereby convert amplitude or frequency modulated input to an output stream of low intermediate frequency ("IF") frequency pulses, in which the instantaneous frequency modulates with the input wave (i.e. AM/FM transposed to an IF band). This output stream is provided as a quasi-digital frequency-pulsed modulated signal. When AM modulated the conversion is made through an intrinsic logarithmic scale and then output.

The same frequency-pulsed modulated output can also be converted to baseband or demodulated (0 Hz to F_max) to a voltage varying with time via the adjunction of an analog frequency to amplitude converter, a peak detector or a digital counter, logic inverter, and digital scaling circuit.

The innovative FM-LDA circuit can perform several functions, some simultaneously: Logarithmic amplification, signal regeneration, frequency conversion, noise filtering, interference rejection, and analog/digital amplitude/frequency demodulation. More:

- In AM mode, the output frequency is proportional to the logarithm of the input voltage.
- By amplifying the signal while reducing noise over n cycles, as part of the non-conventional process of frequency transformation, the LDA acts as a regenerative receiver and amplifier.
- An intrinsic log function converts linear input to logarithmic output, making the detection possible at very low input levels which allows for roughly 100 dB of usable dynamic range.
- The LDA can transcode an FM input to a different frequency
- The LDA can use adjustable frequencies to handle various channels and circuit boards.
- The LDA receiver circuit provides very high sensitivity
- The LDA is cost-effective, scalable, and capable of being integrated directly into IC chips
- The LDA can accommodate analog, digital, AM, and FM demodulation. Other type of demodulation such PM are feasible with the adjunction of additional circuitry— making it useful in a wide range of practical applications.

Applications are numerous. LDA technology can be integrated into nearly every electronic system that would benefit from higher sensitivity, higher dynamic range, lower power consumption, better interference rejection, increased bandwidth, better signal to noise ratio SNR, longer range, and/or cleaner amplification.

Figure 1:
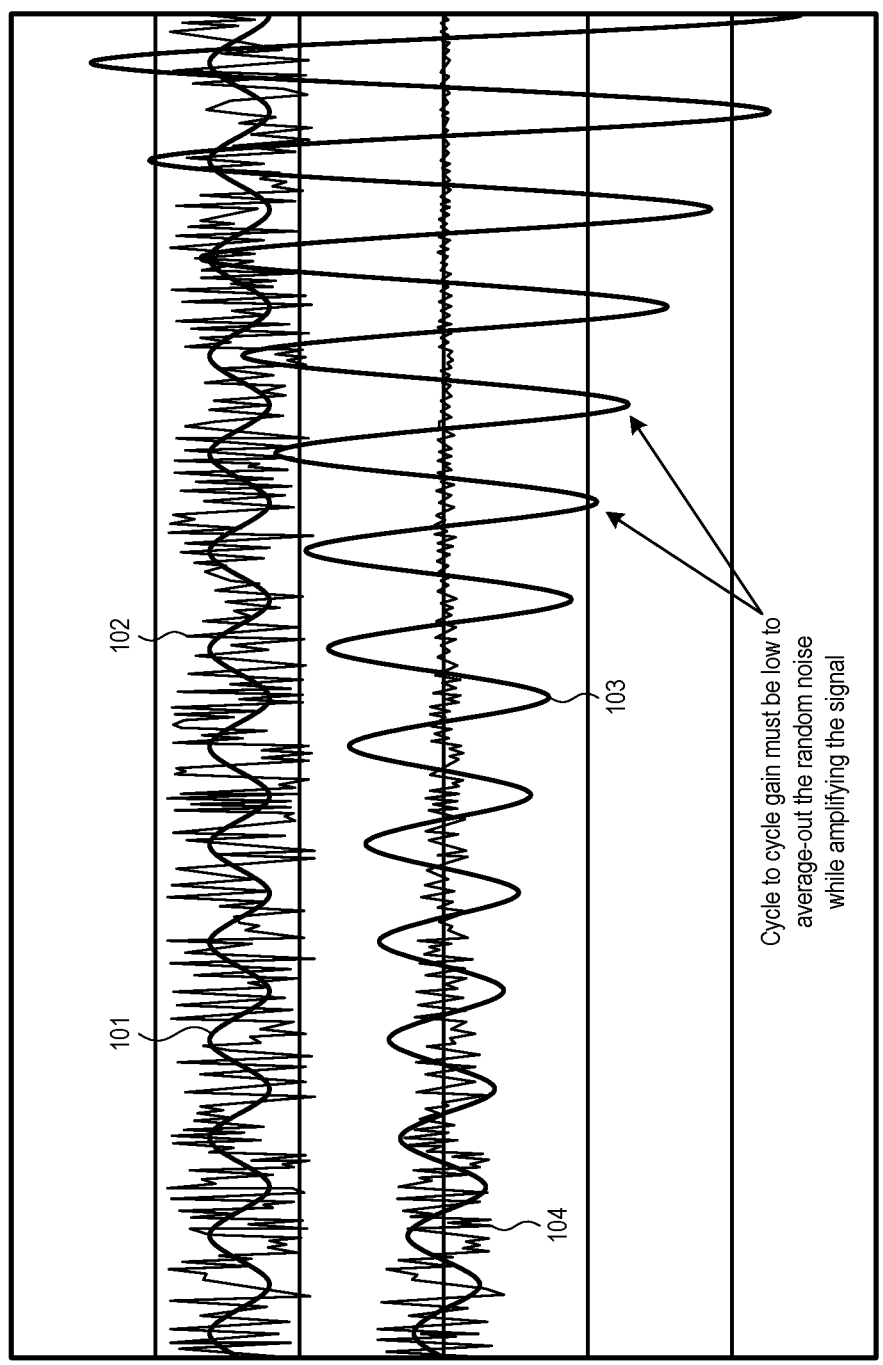
FIG. 1 depicts example input and output signals from an LDA.

FIG. 1 depicts example input and output signals from an LDA. An LDA can give a low-level input signal 101 within its frequency capture bandwidth, masked by white Gaussian input noise 102. The LDA can regenerate an amplified input signal 103 over a number of periods, until reaching a threshold level. When the input threshold level is reached, the LDA can generate an output pulse, and restart its cycle.

Because Gaussian noise is random and uncorrelated with the input signal, and as the regenerated amplified input signal 103 increases, the noise can be averaged out and kept to the same value therefore not amplified over a number of periods, as shown by reduces noise 104.

Figure 2:
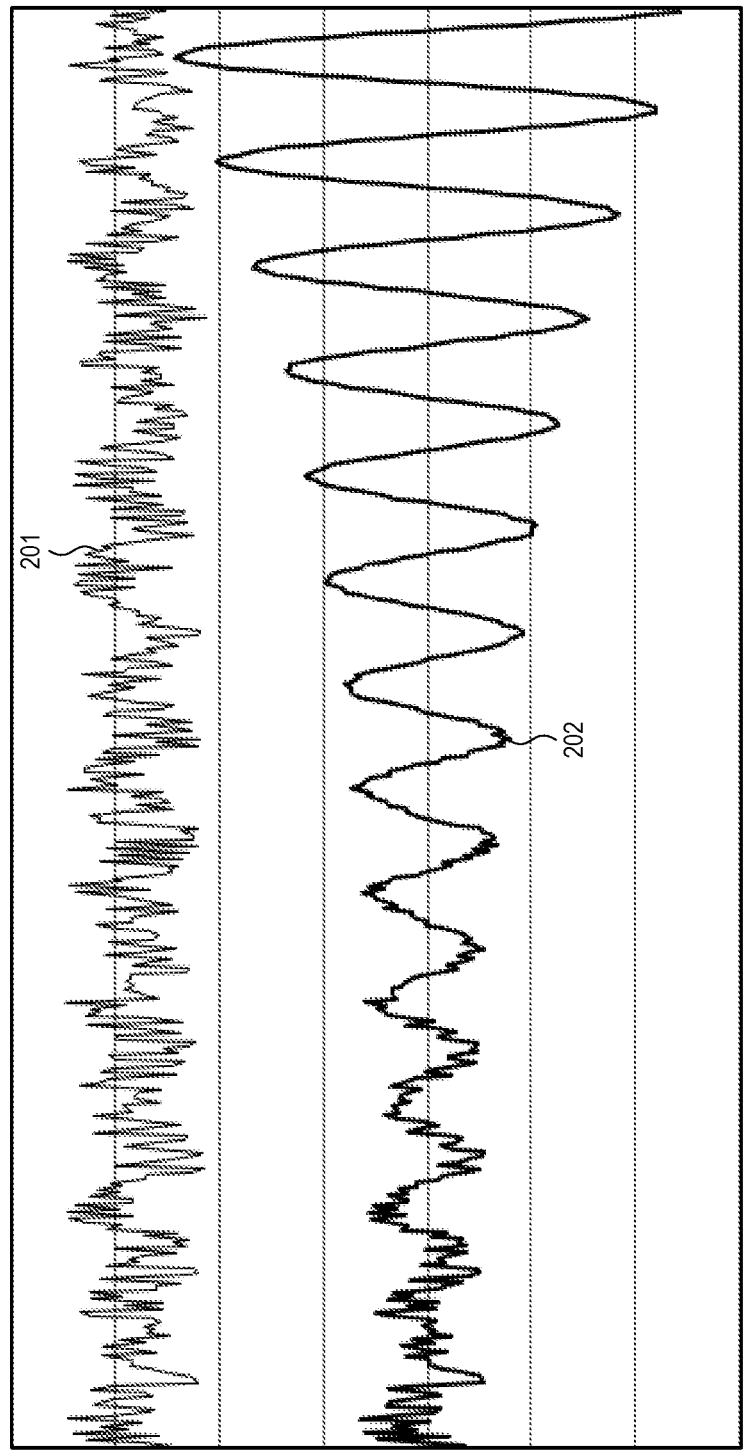
FIG. 2 depicts a combination of the input and output signals from FIG. 1.

FIG. 2 depicts a combination of the input and output signals from FIG. 1. When combining input signals 201 over a number of periods, the resulting curve 202 represents a regenerated and amplified signal with reduced jitter over time.

This effect is similar to a LASER in which photons are amplified in a cavity at a specific wavelength. At a resonance frequency, a standing wave builds up energy constructively over time. At the end of the buildup period, a discharge of higher energy is produced, and the process restarts.

Another example to explain the regeneration process that takes place from the noise floor and the slow buildup of coherent energy (and reduction of amplitude jitter) is the following. There is a large noisy room with two similar mechanical forks of high quality factor and identical frequency resonance, each one at the other side of the room. The first fork (excitation source) is beating at a low and constant level. The second fork can barely "hear" the first one due to the high level of noise. After some time, the second fork will amplify and resonate at the tone frequency of the first one with high amplitude level irrespective of the noise level in the room due to its high quality factor, due to the weak coupling between both forks and finally due to its slow synchronous buildup of mechanical energy. An important factor is the slow response in order to build up the signal but average out the random noise.

Figure 3:
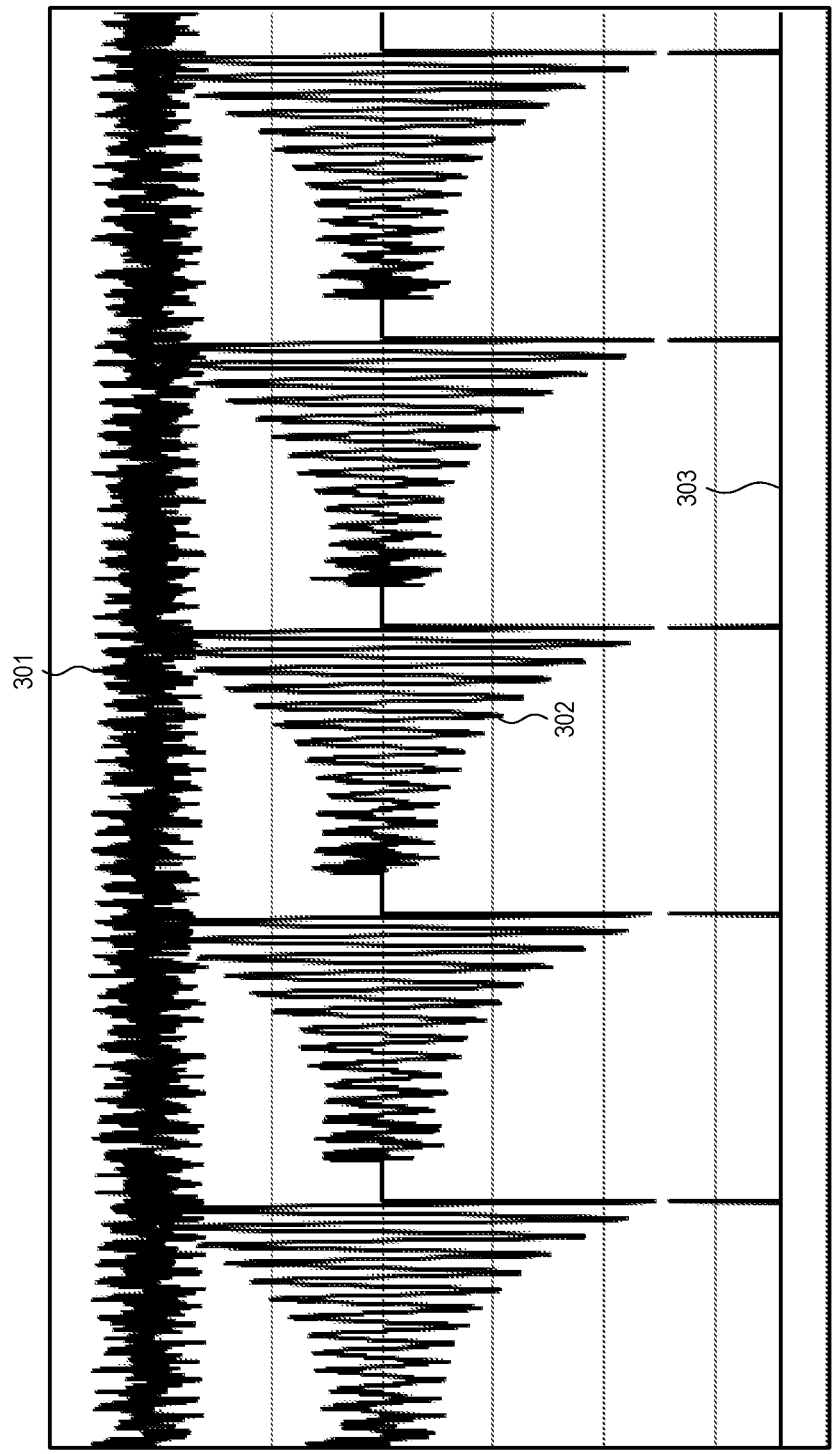
FIG. 3 depicts an input with signal and noise, a regenerated signal, and output frequency pulses at low level.
Figure 4:
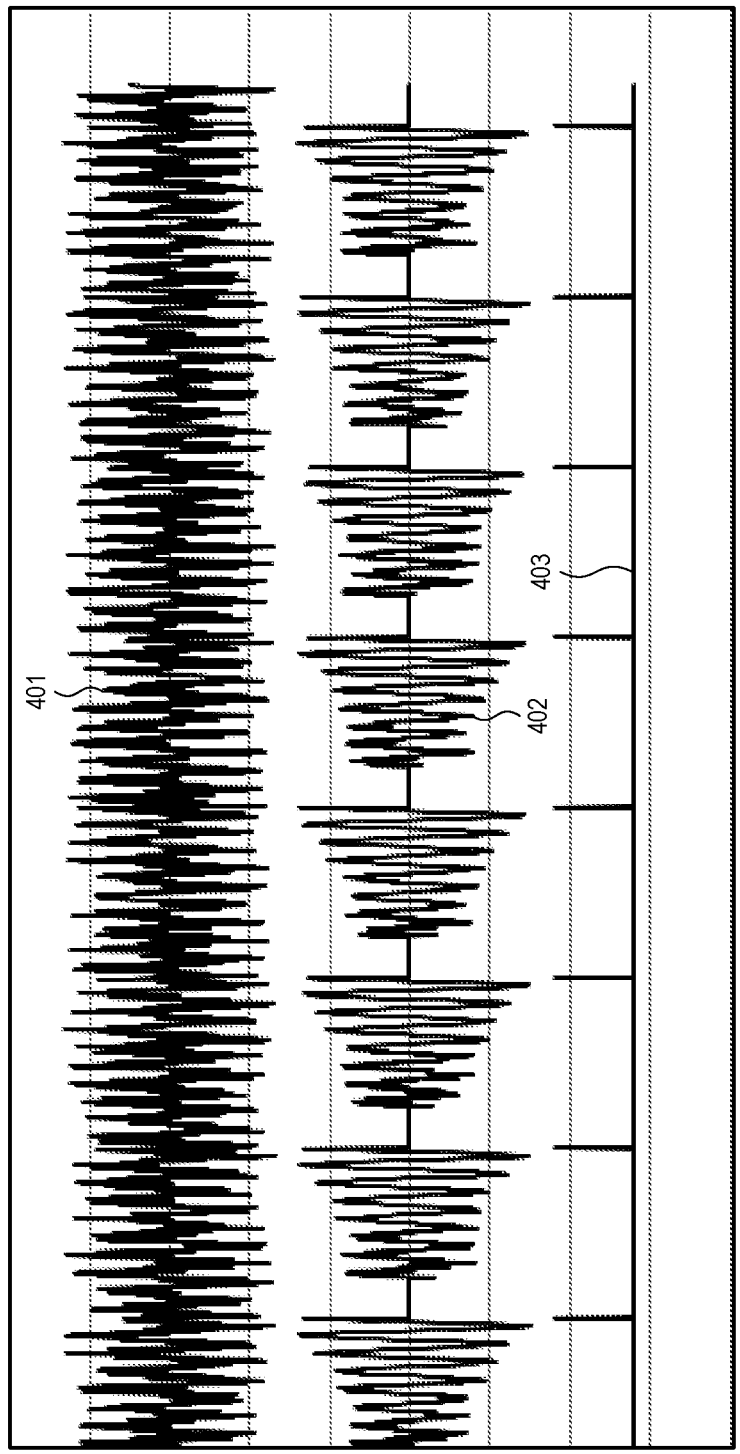
FIG. 4 depicts an input with signal and noise, regenerated signal, and output frequency pulses at higher input level.

FIG. 3 depicts an input with signal and noise 301, a regenerated signal 302, and output frequency pulses 303 at low level. FIG. 4 depicts an input with signal and noise 401, regenerated signal 402, and output frequency pulses 403 at higher input level. FIGS. 3 and 4 show a longer time scale of the input, and the effect on output frequency: The input signal (including noise) is shown in at the top, the regenerated signal is shown in the middle, and the output repetition rate is shown at the bottom. When the input signal is at a low level, as shown in FIG. 3, the LDA takes time to regenerate the signal and reach a constant threshold value. In the time window of FIG. 3, five regeneration cycles are created. FIG. 4 shows a higher input signal and a corresponding faster regeneration time to reach the threshold. As a result, the LDA produces more regeneration cycles in the same time window. In addition, the output pulses are almost constant in amplitude for any low-to-high input signals, which is remarkable given the large dynamic range involved.

As far as the AM mode, the output frequency of the LDA is proportional to the logarithm of the input voltage:

$$F_{OUT} = F_0 + K \times \log(V_{IN_{RMS}}) \text{ in Hz, or}$$

$$F_{OUT} = F_0 + K_2 \times (L_{IN_{dB}}) \text{ in Hz}$$

where:
$F_0$ is a minimum fix frequency,
K and $K_2$ are constant values,
$V_{IN_{RMS}}(t)$ is the RMS value of the input signal $V_{IN}(t)$,
$L_{IN_{dB}}$ the input level $L_{IN}$ in dBm,
$F_{OUT}(t)$ is the output frequency.

If desired, the output frequency can be converted into voltage modulation in analog or digital form. In this case, the output voltage after low pass filtering becomes $$V_{OUT\_RMS} = K_3 \times \log(V_{IN_{RMS}}) \text{ in } V, \text{ or}$$

$$V_{OUT\_RMS} = K_4 \times (L_{IN_{dB}}) \text{ in } V$$

where:
V<sub>OUT_RMS</sub>(t) is the output voltage, and
K3 and K4 constant values.

An LDA with FM demodulation circuit can possess many intrinsic properties of value to a wide range of commercial technologies. The following paragraphs include a non-exclusive list of the types of value that may be possible from an LDA with FM demodulation circuit.

The conversion of voltage modulated input signals to frequency modulation in the IF range, and the use of logarithmic decompression, are particularly effective at reducing noise and expanding the dynamic range of weak signals relative to noise. These attributes make the LDA ideally suited to many applications, such as:

- splatter-prone radar; micro-signal medical devices like ultrasound, MRIs, and CAT scans; fish finders and sonar in general; and collision avoidance
- signal analyzers, power meters, and RF transmitter amplifiers
- wireless networks such as Wi-Fi
- simple, low power consumption frequency-to-digital converters based on LDAs, as a replacement for high resolution, fast, but expensive AD converters
- pipeline metering and communication in the oil, water, and gas industries
- replace expensive ADC converters with several possible configurations of LDAs, PLLs The ability of LDAs to filter random noise from weaker signals gives them the means to extract, for example, a few dBs of signal from the noise floor for smart phone devices or cellular base station receivers. To further reduce the output power of cell phones (improved RF budget link), and thereby extend their battery life and range by a factor n, LDA technology can be integrated into mobile phones. Further, cellular base stations could use LDAs to recover weaker signals. LDAs can also reduce the power consumption of microprocessors, such as CMOS processors, by integrating the LDAs directly into processing chips.

Since the LDA regenerates the input signal and actively reduce noise, the LDA can significantly increase the SNR ratio even if placed after the first or second block in an amplification chain. For instance, a very good sensitivity for FM radio demodulation at 88-108 MHz has been measured when combining an LDA with a low-noise amplifier.

LDAs can demodulate directly analog/digital AM, FM and other modulations such as FH-SS, and n-ary analog and digital FM and AM modulations with addition of more circuitry such as PLL(s), mixer(s), synthesizer(s), etc.

LDAs can regenerate many types of low level RF signals if tuned near or at the RF modulating frequency.

Simplification of wireless digital receiver by replacing several functions of a standard digital receiver (RF to low intermediate frequency or to baseband with direct digital conversion).

In baseband microvolt sensors (e.g. audio bandwidth 20 Hz-20 KHz), The LDA can be used as a very low noise and high discrimination conversion gain amplifier with digital output.

Figure 5:
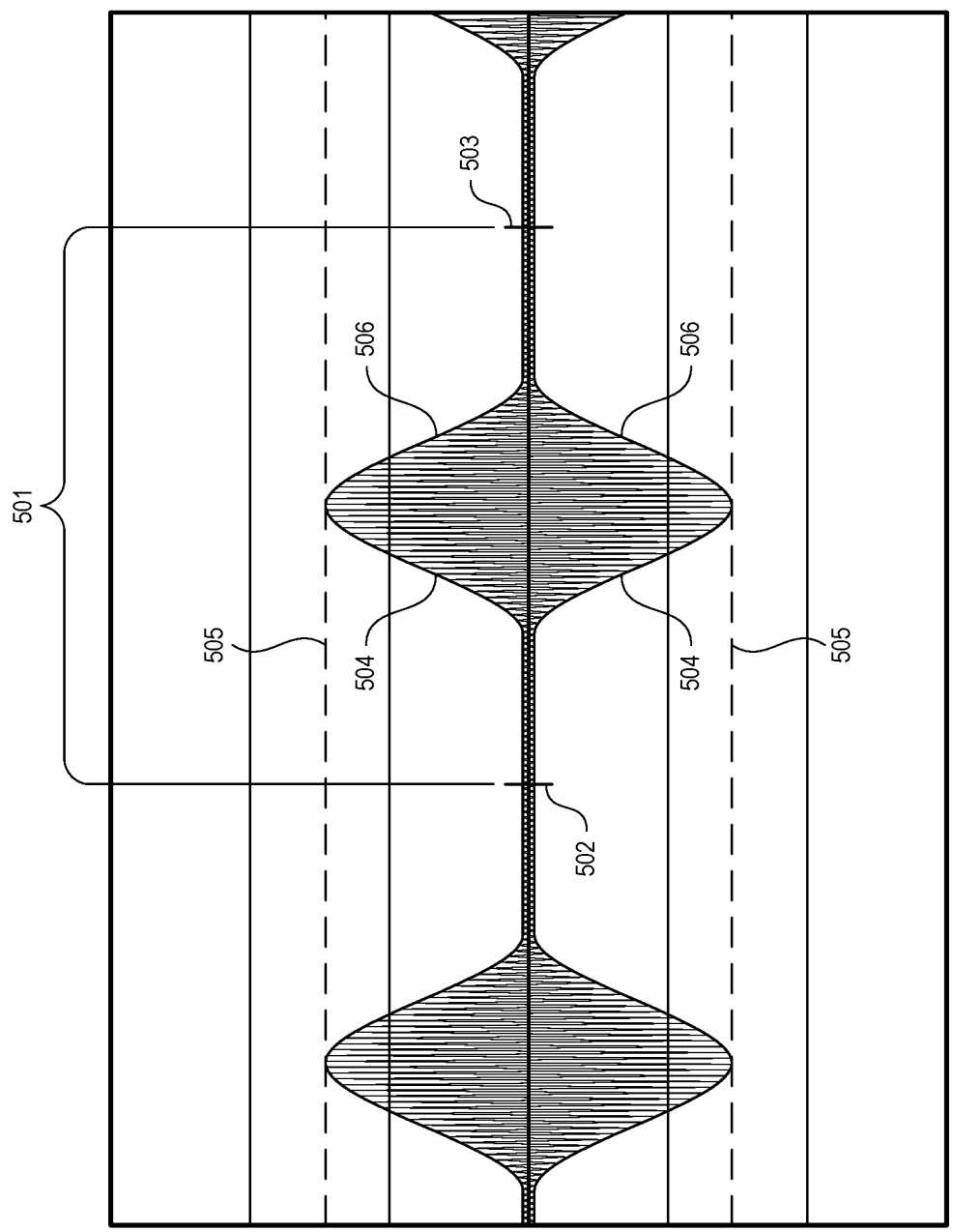
FIG. 5 depicts time variant oscillations and quenching cycle of an LDA with FM demodulation capability.

In one embodiment, the LDA can be regarded as a LC circuit with a variable conductance, the latter varying cyclically from positive to negative. FIG. 5 depicts time variant oscillations and quenching cycle of an LDA with FM demodulation capability. More specifically, FIG. 5 depicts a cycle 501 from the start of the cycle 502 to the end of the cycle 503. The oscillation builds up 504 until it reaches a threshold level 505 where the oscillation is shunt 506 progressively to zero.

Figure 6:
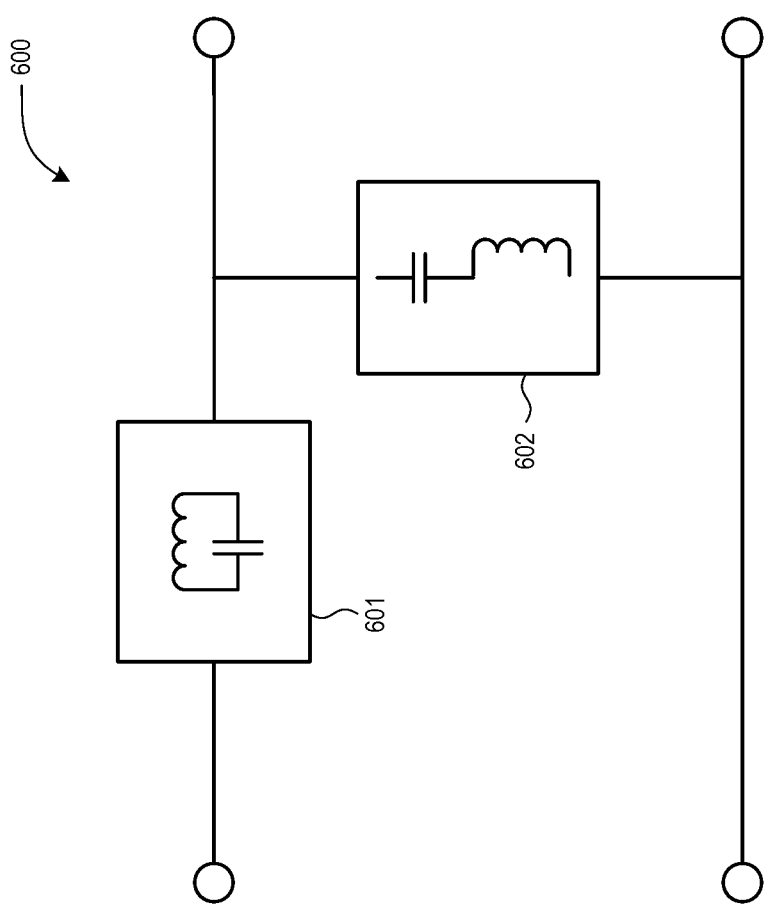
FIG. 6 depicts a quadripole with a parallel resonant circuit and a series resonant circuit.

FIG. 6 depicts a quadripole 600 with a parallel resonant circuit 601 and a series resonant circuit 602. The LDA with FM demodulation capability is based on the use of a quadripole made of a parallel and series resonator circuits 601 and 602 as shown in FIG. 6. It is designed to be a bandpass filter with a null phase in the passband. An example of parallel resonant circuit is a L an C connected in parallel, a line of transmission having open(s) or short(s) stub(s) adequately placed, a crystal resonator, a SAW circuit, a BAW, or a combination of these, etc. An example of series resonant circuit is a L an C mounted in series, a line of transmission having open(s) or short(s) stub(s) adequately placed, a crystal resonator, a SAW circuit, BAW, or a combination of these, etc.

Figure 7:
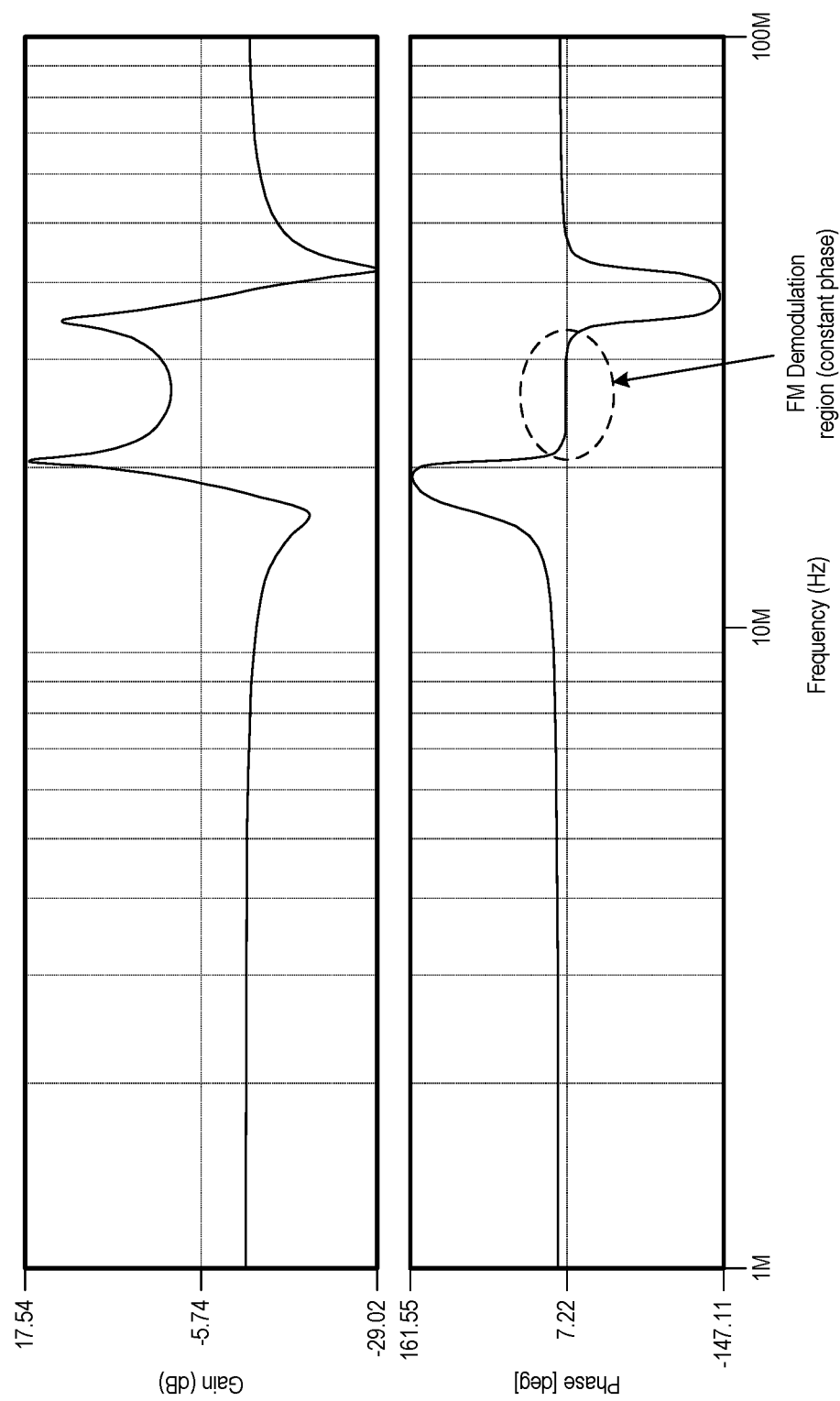
FIG. 7 depicts a bode plot showing the approximate response of the quadripole.

The transfer function in amplitude and phase of the quadripole of FIG. 6 is shown in FIG. 7. Horizontal scale is frequency in Hz and vertical scales are respectively gain in dB and phase in degree.

FIG. 7 depicts a bode plot showing the approximate response of the quadripole. The useful operating range for FM/AM demodulation in shown in the ellipse with dashed lines. The plots in FIG. 7 show the amplitude versus the frequency (top) and response phase vs. frequency (bottom). Depending on the design of the quadripole and interaction with the rest of the LDA, the gain can be designed to be flat or rounded versus pointy with the two spikes as shown in the diagram.

Figure 8A:
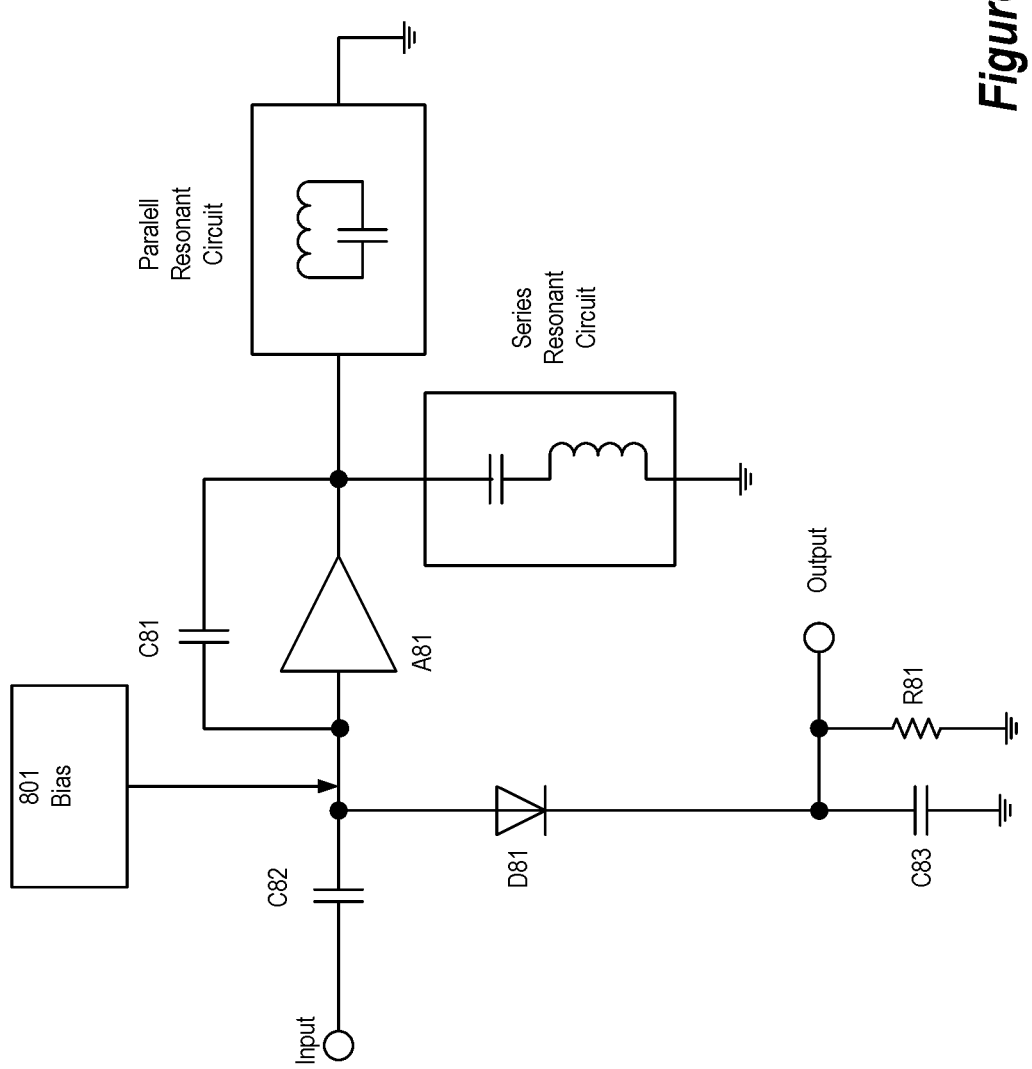
FIGS. 8A, 8B, 8C, and 8D depict various embodiments of a block Diagram of LDA with integral FM demodulation circuit.

FIG. 8A depicts a block Diagram of LDA with integral FM demodulation circuit. The behavior principle is the following: An amplifier A81 is made to oscillate with the capacitor C81 in loopback. A typical amplifier may be a NPN, PNP transistor, a FET transistor, A MOS transistor, a dual gate FET transistor, etc. Also, the configuration of the active circuit can be Darlington, common-base, common collector, common emitter, Cascode, differential pair, etc. Other types of amplifier, such as single or multiple stages amplifiers, logic amplifier may be used. An amplifier can be made by any number of processes, such as Silicon, Bi-CMOS, GaAs, or any other process.

The simplest implementation is to have a 180-degree shift from the input 801 to the output of the amplifier A81 and the oscillation to be maintained with C81 as a weak or strong coupling. In other word, the value of C81 reduces the amplifier gain to a low value as desired. The quadripole is added to the output of A81 and due to its high lower attenuation in the passband makes the amplifier resonate at or around the center frequency. The optimal FM demodulation mode happens when the circuit is adjusted to the center of the null phase range and operates there as shown in FIG. 7. Moreover the maximum frequency deviation that can be demodulated without distortion is equal or larger than the null phase bandwidth, so the bandpass filter quadripole can be designed to accommodate the target deviation, whether narrow or wide.

Another important piece of the LDA behavior is the RC circuit R81 and C83 acting as a sampling circuit. When connected to the amplifier, it charges cyclically and as its potential grows, the voltage across R81 grows that increase the output current of the amplifier. At the same time, the input bias current of the amplifier reduces and at a given threshold switches off the amplifier and therefore the oscillations. At this point, the charge accumulated into C83 discharges in R83 and as a consequence the voltage on R81 and C83 decreases to zero. The cycle restarts and since the potential on R81 and C83 is low the amplifier bias current tends to increase and after a little period of time the oscillation build up again.

After low pass filtering, the signal on R81 and C83 is the output repetition frequency and its shape may resemble the envelope of the cyclic oscillation frequency shown in FIG. 5.

The diode D81 couples the amplifier to the RC circuit R81 and C83 and acts as a low pas filter with good RF behavior. It has a low impedance when in conduction (positive half cycle of the input voltage) and high impedance when in non-conduction (negative half cycle of the input voltage) acting as a rectifier and low pass filter when loaded with a RC circuit.

The input is weakly coupled to the top of diode D1. The input matching is important and a good matching can improve the performance by a significant factor. An optional capacitor may be connected between the cathode of D81 and the bias of the amplifier to increase the coupling and facilitate the repetitive cycling.

In another implementation, the diode D81 can be replaced with an inductor of relatively high value e.g. ten times the value of the inductance(s) of the resonator and in a range of 100 nH to 1 mH. If the LDA oscillation operating frequency is too high, the parasitic may impact adversely the low pass effect and a more ideal component such as a diode may be used. In a further additional implementation, D81 can be replaced by an active component such as a transistor that is properly biased.

There are several types of FM discriminator or demodulators: Foster-Seeley, Travis, quadrature detector, PLL amongst other. The Foster-Seeley discriminator uses a special center-tapped transformer that is tuned for the frequency of use and two diodes in a full wave rectification. When there is no deviation, both halves of the transformer are equal. When a FM signal is applied, the balance is destroyed and a signal appears at the output that is proportional to the frequency deviation.

The Travis discriminator is similar to Forster-Seeley whereas the secondary of the transformer has a center tap and two opposite branches, each branch connected to a tuning circuit and a slope detector. First tuning circuit resonates slightly higher than the carrier, while the second one slightly lower. The output is the difference between the voltages of slope detector 1 and 2. When a FM modulation is applied and deviates toward a frequency higher than the carrier, the voltage of detector 1 goes positive while the one of detector 2 negative. The output voltage and difference between both is positive. When a FM modulation deviates toward lower than carrier frequency, the opposite happens and the output voltage becomes negative. The addition of the two resonance curves of opposite signs, gives a nice "S" curve characteristic output, for which the large middle section is linear.

In the quadrature detector, the input is split in 2 and one of the paths is delayed by 90 degrees and applied to a resonant LC circuit. The 2 signals finally feed a phase comparator and the result that is low pass filtered is the demodulated FM output.

The PLL is one FM discriminator and was adopted with the easy access of integrated circuits. The phases of the incoming FM signal versus the one of a voltage-controlled oscillator (VCO) are compared. The result is low pass filters and controls the VCO. As the frequency of the input changes, a correction voltage appears at the phase detector that wants to compensate the phase difference by increasing or decreasing the phase and frequency of the VCO. If the loop bandwidth of the PLL is designed appropriately, the correction voltage to the VCO is also the demodulated output voltage.

In contrast, the LDA technologies disclosed herein bring some important novelties. An S-curve characteristic output is provided as other discriminators and the LDA simulates the performance of a Travis discriminator simply by having a low gain amplifier that is only oscillating if the phase of input and output are 180 degree from each of other. However in the LDA technologies disclosed herein the S-curve exceeds the quadripole passband bandwidth. In consequence the FM-LDA does not need an automatic frequency control AFC as conventional FM discriminators and it does not need to sit exactly in the center of the S curve. In our implementation there is an auto-centering effect.

When the phase is distorted into the S-curve, the LDA oscillator tries to stay at the center of it. If the deviation goes high in frequency, the repetition rate decreases, if the deviation goes below or lower in frequency, the repetition goes faster. It is similar to having a power meter which can have three readings: close to center channel, center channel or above channel. If the S-curve is very wide, it can demodulate very wide FM. On the other side, if the S-curve is narrow, it can demodulate narrow FM.

The output repetition frequency contains the phase and frequency information and is modulated at a low intermediate frequency by the FM input signal. Standard FM discriminators employ a constant amplitude. In the LDA technologies disclosed herein, this is provided intrinsically by the LDA that has a large amplitude input dynamic range and that provides an almost constant repetition rate amplitude regardless of the input amplitude large or very small. The baseband signal is recovered by an analog or digital frequency to voltage converter (FVC).

Since being regenerated by the FM-LDA, the advantages here include one or more of the following: very high sensitivity over a high dynamic range, constant repetition output amplitude, high skirt ratio (high selectivity), and simultaneous FM & AM demodulation that add a few more dB of amplitude to the baseband demodulation amplitude.

Figure 8B:
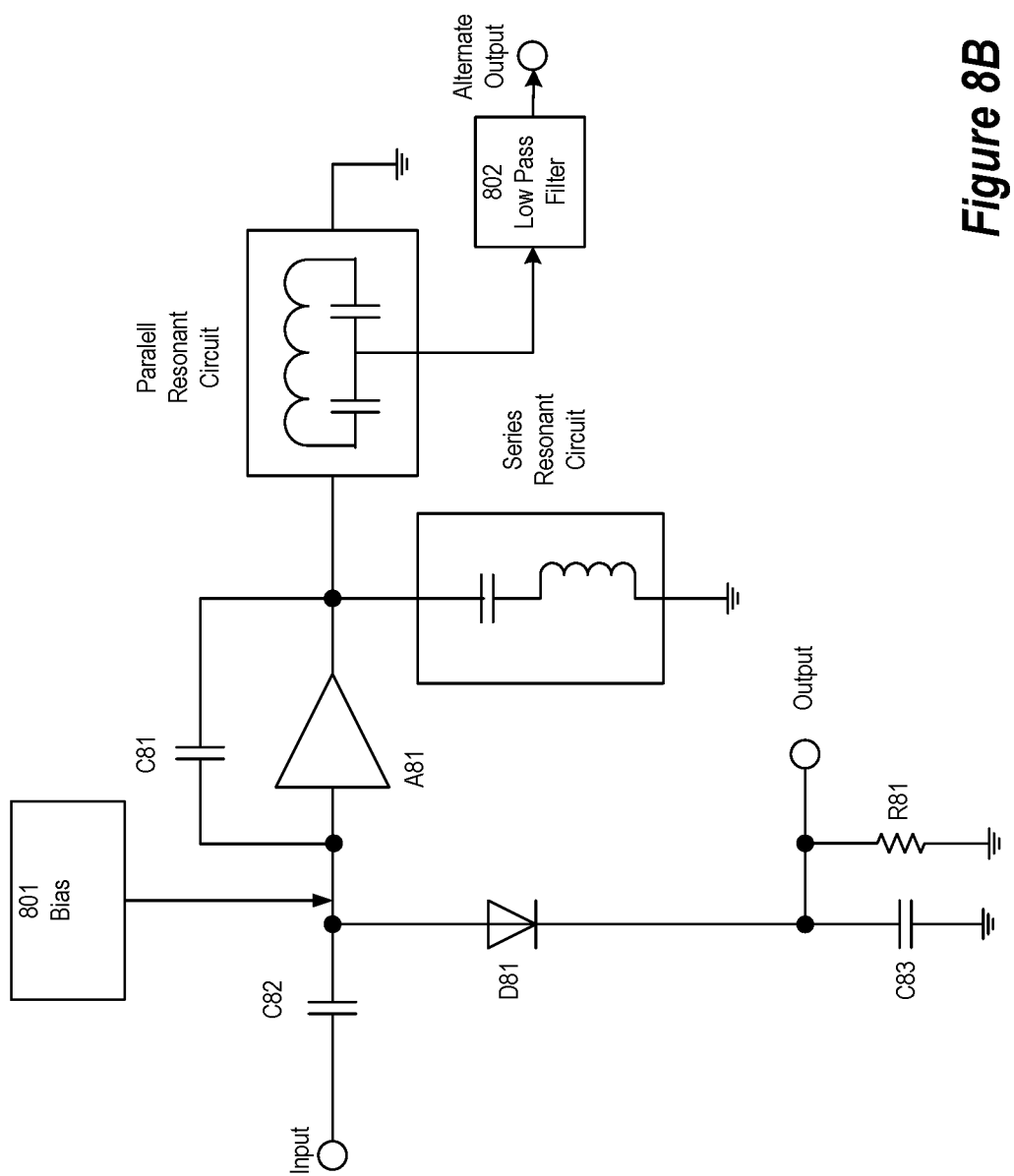
Figure 8C:
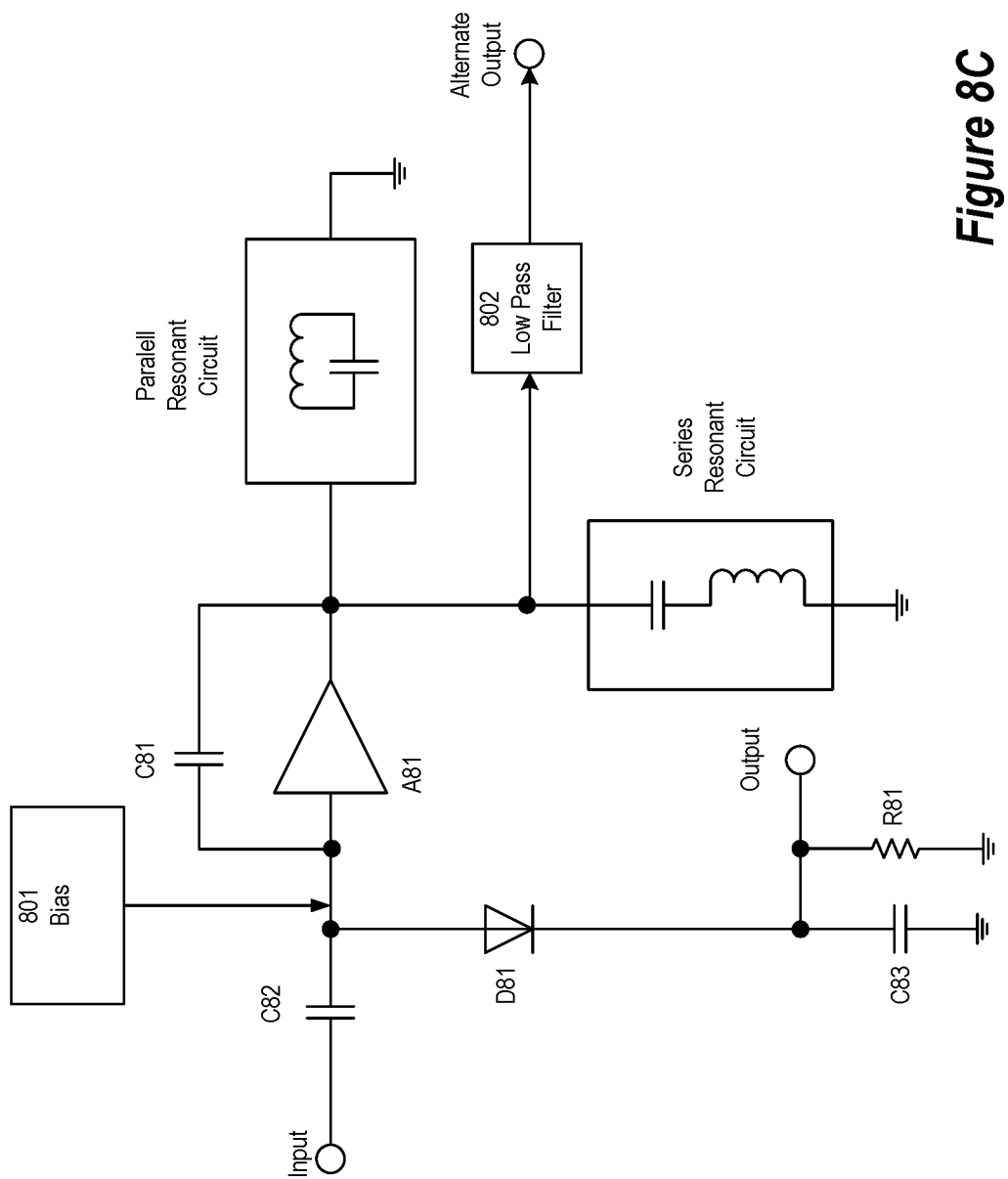

FIGS. 8B and 8C depict other embodiments of an LDA with integral FM demodulation circuit and an alternate output. The embodiments in FIGS. 8B and 8C include a low pass filter 802 configured to filter signals passing to an alternate output. In FIG. 8B, the low pas filter 802 filters signals exiting the parallel resonant circuit to the alternate output. In FIG. 8C, the low pas filter 802 filters signals that enter the parallel and series resonant circuits. Other variations of these embodiments are possible.

Figure 8D:
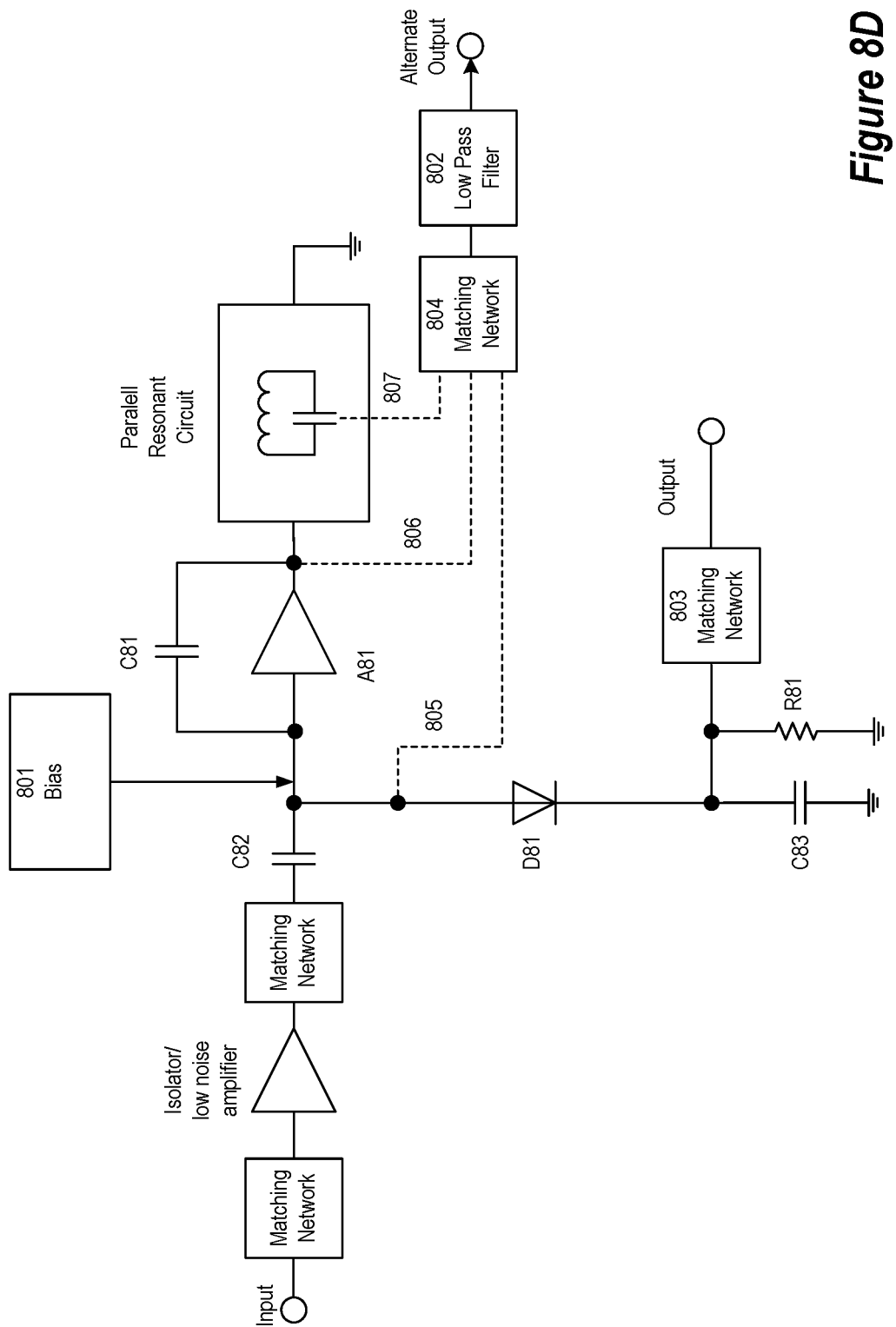

In another implementation of FM-LDA, the series resonant circuit may be removed and the LDA may still demodulate analog or digital FM based on the slope detection method. Narrow band or relatively wide band FM may be demodulated. Digital FM includes modulation such as n-ary FSK, MSK and Gaussian filtered or not Gaussian filtered. An example of analog FM is audio FM modulation from 20-20 KHz. An example of digital FM modulation is 4-GFSK. FIG. 8D shows the block diagram of the LDA. This is similar to FIGS. 8A, 8B, 8C, 9, and 14 where the series resonant circuit has been removed. All the other descriptions, functions and methods described in this patent continue to apply for this implementation for instance the analog or digital FN converter.

Figure 8E:
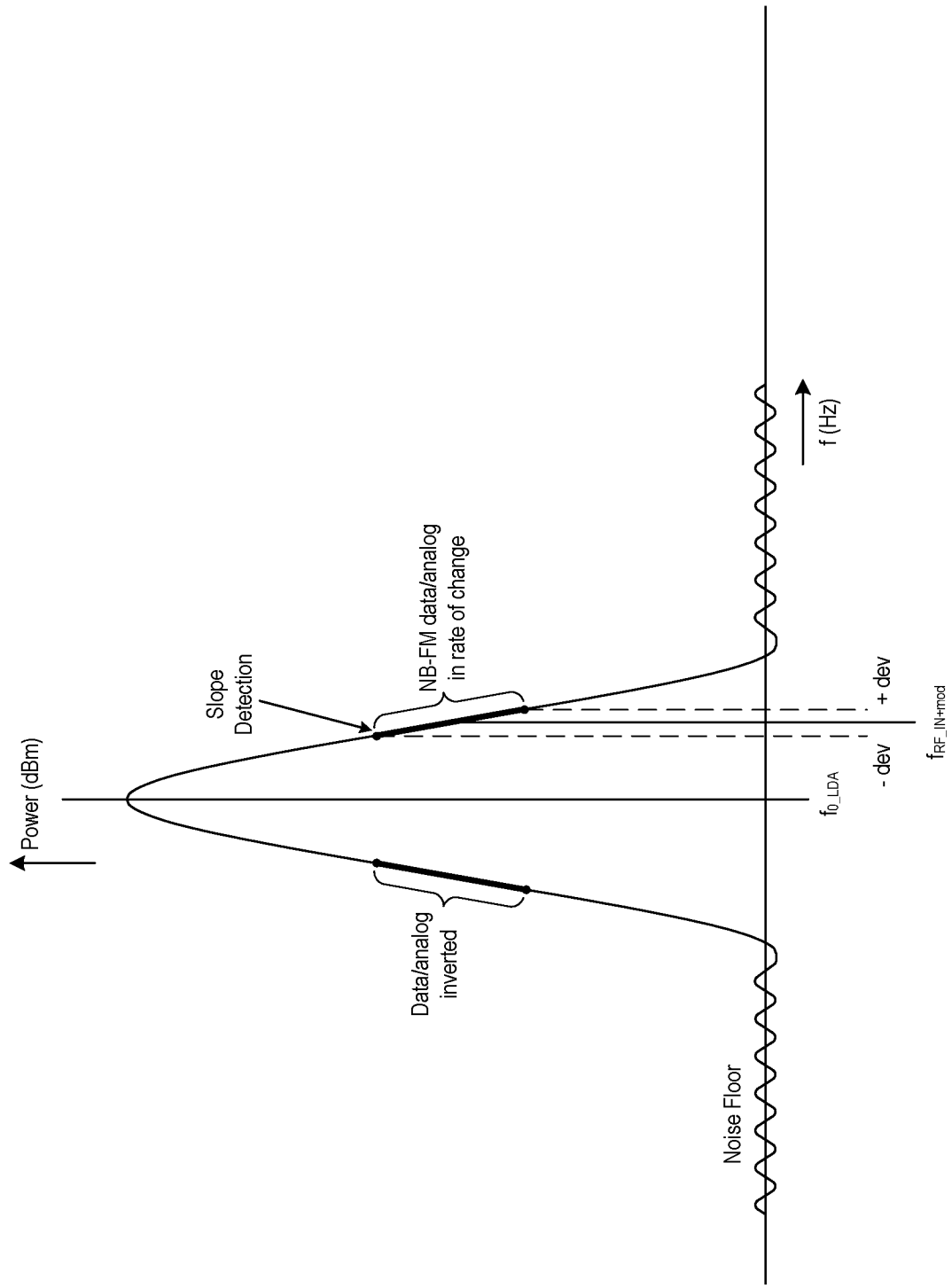
FIG. 8E shows where a narrow band (NB) FM demodulation can be done versus the center of the LDA frequency Bell-shape response.

In that slope detection configuration, the optimal FM demodulation mode happens when the input RF modulated signal frequency is adjusted to the left or right slope of the frequency Bell shape of the LDA. FIG. 8E shows where a narrow band (NB) FM demodulation can be done versus the center of the LDA frequency Bell-shape response. Since the information is carried by the rate of change, little distortion is expected whether the deviation is up in the slope, centered in the slope or low in the slope. A preferred implementation is to demodulate on the right slope center where the analog (e.g. audio) or data is not inverted. Oppositely if demodulation is done on the left slope, the analog signal or data will be inverted. It may be un-inverted by negating the signal or multiplying it by −1 further on in the receiver chain.

Figure 8F:
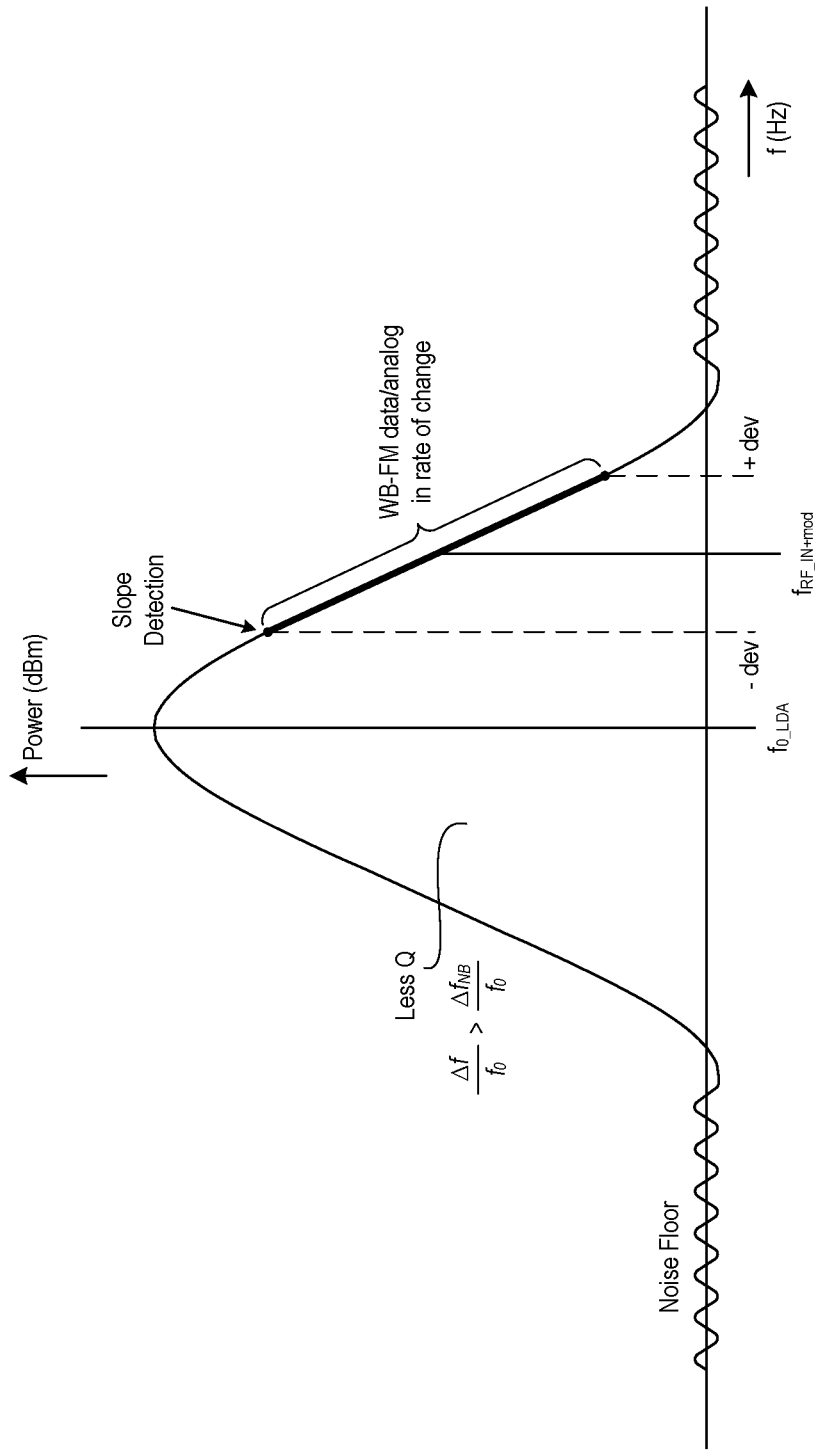
FIG. 8F shows the demodulation of a relatively wideband (WB) FM signal.

FIG. 8F shows the demodulation of a relatively wideband (WB) FM signal. For this to happen, the LDA needs to exhibit a wider bandwidth and may be designed such as the Q factor of the resonant circuit is lowered and other parameters of the LDA updated. This may include the amplifier AC and DC gain, the bias, the feedback capacitor C81 of FIG. 8B, amongst other. In consequence the response of the LDA provides more available slope bandwidth to demodulate the wide band FM modulates signal at shown on FIG. 8F.

Coming back to FIG. 8D, the discriminated output is shown following the matching network 803. To complete the FM demodulation output needs to be followed by an analog or digital frequency to voltage converter. Three alternate outputs are possible that may have a matching network 804 and a low pass filter 802. These three alternate may provide a higher power level of the demodulated signal and may not require a frequency to voltage converter if the low pass filter cut frequency is lower than the repetition frequency $f_{rep}$. In a first alternative 805, the signal is picked up from the input of the amplifier A81. In a second alternative 806, the signal is picked up from the output of the amplifier A81. In a third alternative 807, the signal is picked up from a split in the capacitors in the parallel resonant circuit.

Figure 9:
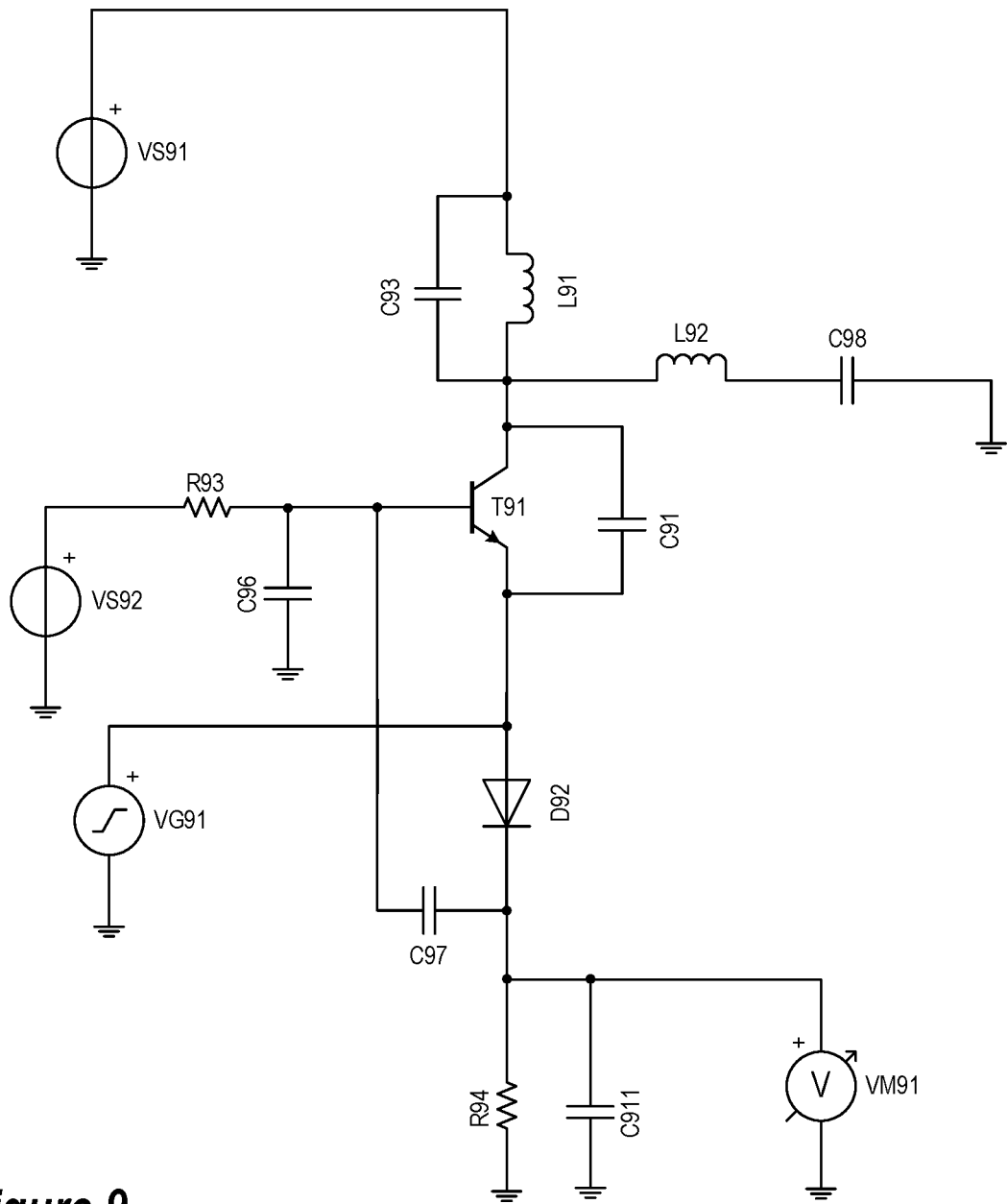
FIG. 9 depicts an embodiment of a schematic of an LDA with FM demodulation.

FIG. 9 depicts an embodiment of a schematic of an LDA with FM demodulation. FIG. 9 shows an implementation of an LDA with FM demodulation capability. The parallel resonator circuit L91/C93 and series resonators circuit L92/C98 are found on the collector of the amplifier. In one embodiment, the amplifier can be a NPN transistor. The transistor providing a 180 degree phase shift between collector and emitter, C91 the feedback oscillator capacitor, VG91 the input source signal coupled through a capacitor (not shown), the bias VS92, R93, and C96, D92 the diode coupling to the RC circuit R94, C911 and the output VM91. An optional C97 is shown for improving the quenching process.

Figure 10:
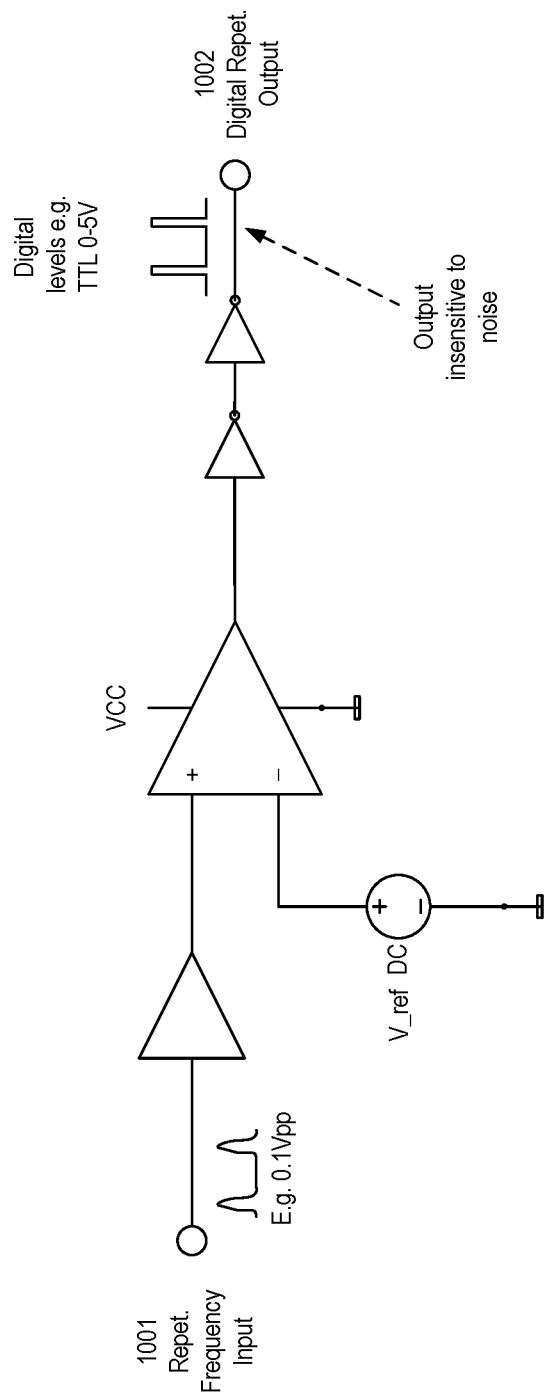
FIG. 10 depicts an example of a conversion of a pseudo-digital frequency input to a digital output pulse stream.

FIG. 10 depicts an example of a conversion of a pseudo-digital frequency input 1001 to a digital output pulse stream 1002. As discussed earlier, the repetition frequency rate is quasi-digital and needs little processing to be shaped in to a digital signal. First if the amplitude peak to peak is smaller than around 0.5 Vpp, it can be amplified. If as shown the amplitude is 0.1 Vpp, the gain is about 5 to 20. The amplification can be done in one or several steps. Thereafter the amplified signal is compared with a reference voltage V_ref and create a logic "1" when above V_ref and "0" otherwise. One or more logic gates can be added to provide sharp edges and TTL level to the now digital signal. The digital repetition frequency output signal 1002 can contain the information in phase and instantaneous frequency. As said earlier it can be carried over long distance or in a noisy environment and is noise insensitive since the information is not in amplitude.

Figure 11:
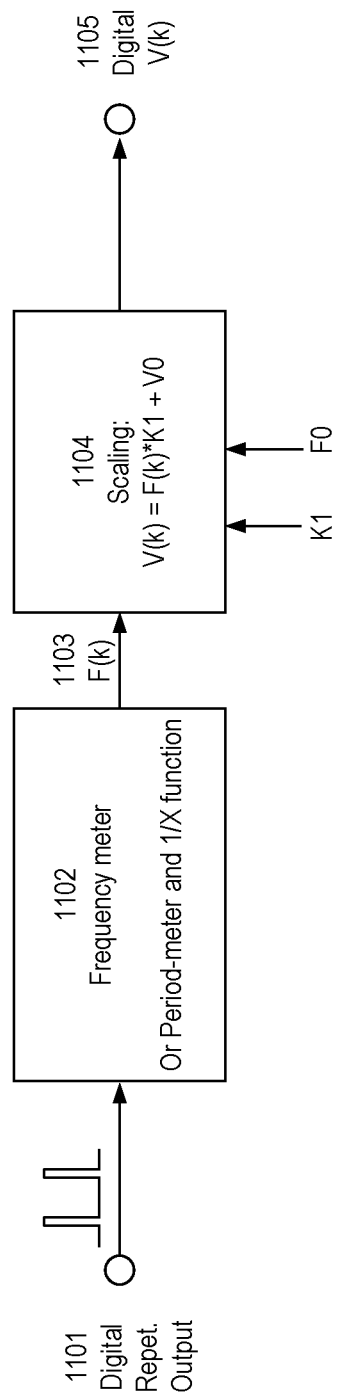
FIG. 11 depicts conversion of digital pulse stream to digital equivalent voltage sample.

FIG. 11 depicts conversion of digital pulse stream 1101 to digital equivalent voltage sample 1105. The digital repetition frequency signal 1101 can be converted into a digital voltage V(k) 1103 by going through an instantaneous frequency meter 1102. Alternatively, the digital repetition frequency signal 1101 can be passed through a period meter followed by a digital inverse function. The digital voltage V(k) 1105 is obtained after scaling 1104 as follow:

$$V(k)=F(k)*K_1+V_0$$

Figure 12:
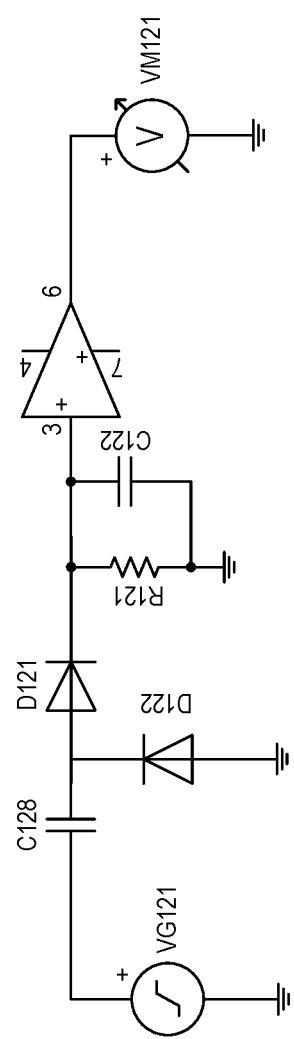
FIG. 12 depicts an example of an analog frequency to voltage converter.

Where
  F(k): kth sample of instantaneous frequency,
  $K_1$: a constant in V/Hz
  $V_0$: constant offset voltage that corresponds to the voltage(frequency) generated when the LDA input is terminated on 50 ohm. V(0)=F(k)*K1 at 50 Ohm FIG. 12 depicts an example of an analog frequency to voltage converter (FVC). The FVC can be used in conjunction with the FM-LDA. It connects to the repetition frequency output of the LDA. As its name indicates, it provides an output with mean value being the converted voltage. Further low pass filtering may be added. This is a simple FVC but it has some limitations: the slew rate is slower than the previous digital approach for instance and typically needs a few pulses to settle to an accurate mean voltage value.

Figure 13:
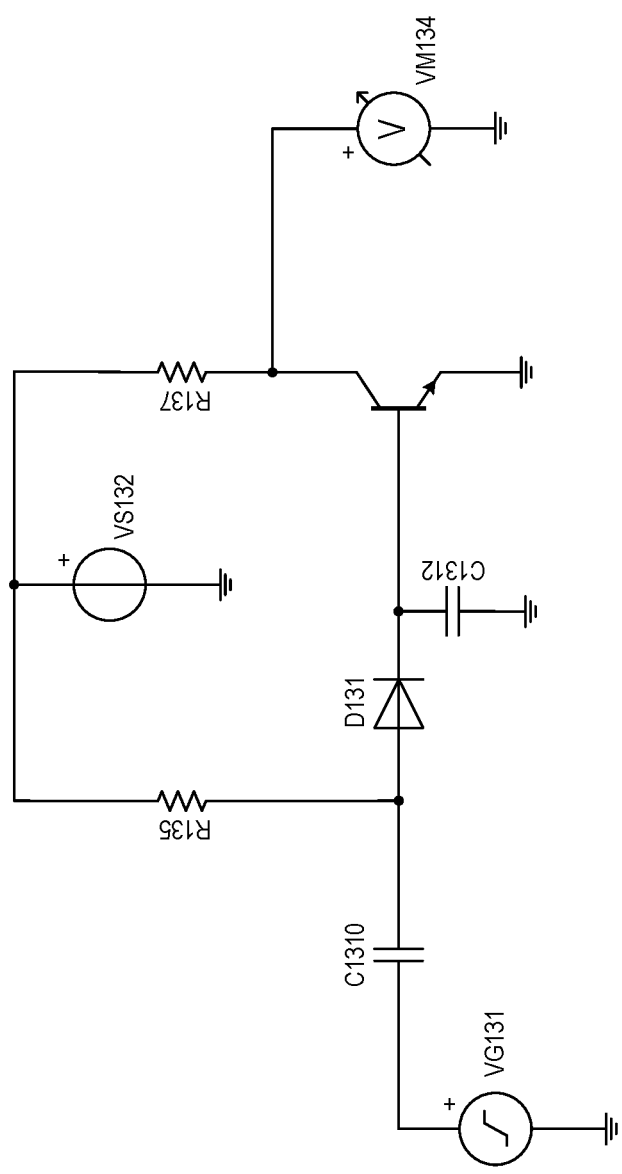
FIG. 13 depicts one embodiment of an analog detector.

FIG. 13 depicts one embodiment of an analog detector. Other embodiments are possible. The analog detector can be connected to the repetition frequency output (VM1), FIG. 9 or as well at the input of the amplifier, base of T91 of FIG. 4. Further low pass filtering and amplification may be added.

Figure 14:
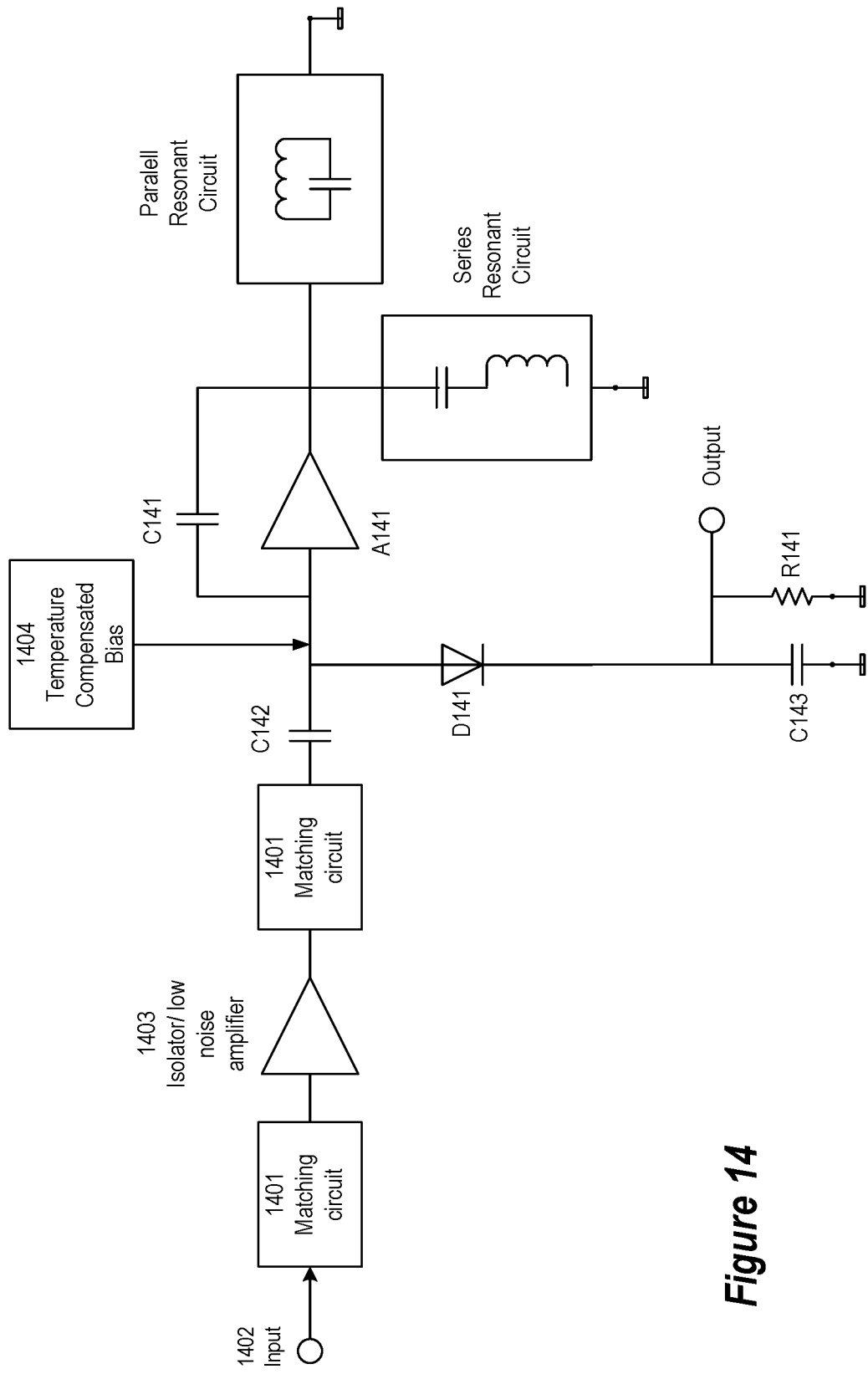
FIG. 14 depicts another implementation of an LDA.

FIG. 14 depicts another implementation of an LDA. In this preferred embodiment of a FM LDA demodulator, the temperature compensated bias 1404 for the amplifier input A141 may be designed to temperature compensates the amplifier A141. For instance if the amplifier is made of a bipolar transistor, its VBE will change with −2 mV/degree. If the DC bias voltage is made to decrease as well by −2 mV/degree, the DC voltage on the emitter will remain constant and therefore the DC current through the resistor R141 as well.

In another implementation of bias source, a temperature compensated current source may be used. When the amplifier is acting as a current amplifier with a constant low frequency gain, the output current will substantially be equal to the bias current multiplied by the gain. With a temperature compensated bias current the amplifier output current will also be temperature compensated if we assume that the low frequency gain remain constant with temperature. For instance if the amplifier is made of a bipolar transistor, and if the DC base current is temperature compensated and constant, the DC collector current will be constant as well. The DC emitter current is the addition of both base and collector currents, that is also constant. A constant current across the resistor R141 creates a constant DC voltage irrelevant of the variation of the base-emitter voltage. The input bias current source being high impedance will automatically provide a voltage that will change with the base-emitter voltage VBE of −2 mV/degree and compensate it.

An LDA with FM demodulation may suffer from some weaknesses such as leak of RF energy from its oscillator throughout the input port. This is an aggravating factor for at least two reasons. First, when the LDA is used as the first stage in a RF receiver, the RF energy is fed backward to the antenna. This causes the antenna to radiate unwanted energy in possibly unintended frequency band(s) and cause EMI noise. Second, the leaking energy can be reflected back to the LDA input with a different phase versus the input signal—a fact that defeats the purpose of regeneration (regeneration is the slow buildup of a resonance phase coherent with the input signal). Therefore it reduces the RF sensitivity.

Also additional use of gain can be obtained when a low noise amplifier LNA precedes the log detector amplifier LDA. Indeed being a regenerative device, the LDA may not fully described by the noise law for linear circuits such as in conventional receiver chain where the first amplifier of the chain is the key element in determining the noise figure of the receiver, as defined per the Friis' formula:

$$NF = 10*\log(F) \text{ in (dB) and } F = F_{A1} + \frac{F_{A2}-1}{G_{A1}} + \frac{F_{A3}-1}{G_{A1}G_{A2}} + \ldots \text{ in(.)}$$

with NF: Total noise figure, ratio in dB
F: total noise figure, ratio in linear
$F_{Ai}$: Linear noise figure of the $i^{th}$ amplifier of the amplifying chain
$G_{Ai}$: Linear gain of the $i^{th}$ amplifier In the case of a regenerative log amp, the regenerative part can improve the SNR when placed in first place or at any location in the receive chain. Therefore the regenerative LDA can make good use of a preceding low noise amplifier even in a noise limited amplifier receiver chain. Such LDA may amplify further a signal buried in the noise because the dynamic range is extended on the low side (noise level) of the signal. In such a noise-limited receiver but without LDA, the hypothetic addition of a LNA would be of little use since the system would be noise limited.

For instance adding a 20 dB gain LNA in front of a noise limited receiver without LDA would barely increase the sensitivity level by 0 to 2 dB. On the other side, by using a log amp with regeneration factor of say 8 dB would improve the sensitivity by a factor of 6 to 8 dB.

Therefore the addition of a matching circuit(s) 1401 at the LDA input may improve the coupling with the preceding circuit and reduce the input reflections. Furthermore the addition of an isolator 1403 at the input 1402 (e.g., an amplifier with high factor of isolation) may further improve regeneration and gain opportunity.

Figure 15:
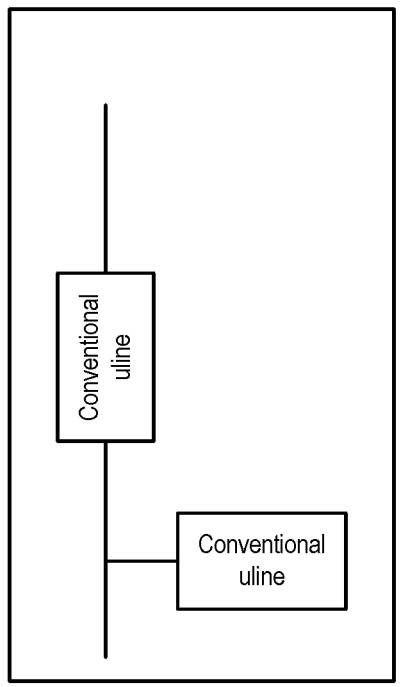
FIG. 15 depicts examples of matching network designed with microstrip lines.
Figure 15:
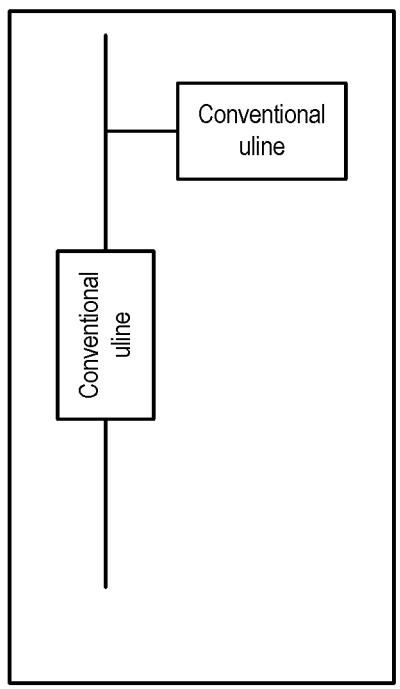

As stated before, the LDA can be regarded as a LC circuit with variable conductance, the later varying cyclically from positive to negative. Consequently the input impedance may vary with time and moves, for example, on an arc in the low right quadrant of the Smith chart in relation with the time variant LDA oscillation cycle. Several input matching scenarios are possible:
A fix matched conjugate at the mean value.
A fix matched conjugate at the impedance value corresponding to the most interesting behavior point that is the signal buildup from the noise.
A fix matched conjugate at the maximum oscillation amplitude level (point in time where the threshold is reached).
A dual impedance matching at a point where a fix matched conjugate is at the mean value or at a point where a fix matched conjugate is at the impedance value corresponding to the most interesting behavior point that is the signal buildup from the noise.
Variable impedance for instance in synchronicity with the LDA behavior cycle FIG. 15 depicts examples of matching network designed with microstrip lines. For example, the series microstrip will change the real part of the impedance and the shunt stub will adjust the imaginary part. The shunt stub can be opened or shorted. The shunted stub can be placed before or after the series microstrip line depending where the normalized load impedance is situated on the Smith chart. If the normalized load impedance is inside the 1+jx circle on the Smith chart then the stub should be placed after and if the normalized load impedance is outside the 1+jx circle on the Smith chart then the shunted stub should be placed before the series microstrip line.

Figure 16:
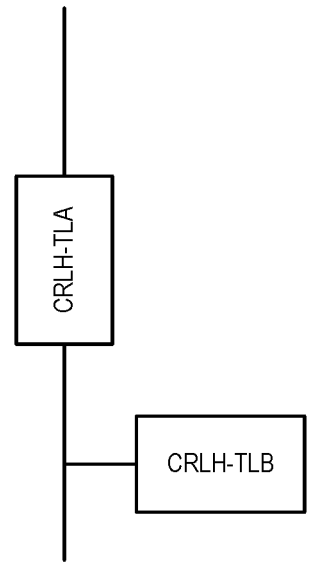
FIG. 16 depicts examples of matching network designed with right-left handed transmission lines (CRLH-TLs).
Figure 16:
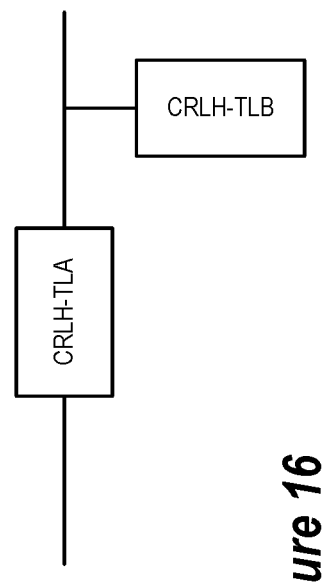

It is possible to replace these conventional microstrip lines with composite right-left handed transmission lines (CRLH-TLs) in order to control different impedances at different frequencies. FIG. 16 depicts examples of matching network designed with right-left handed transmission lines (CRLH-TLs).

Figure 17:
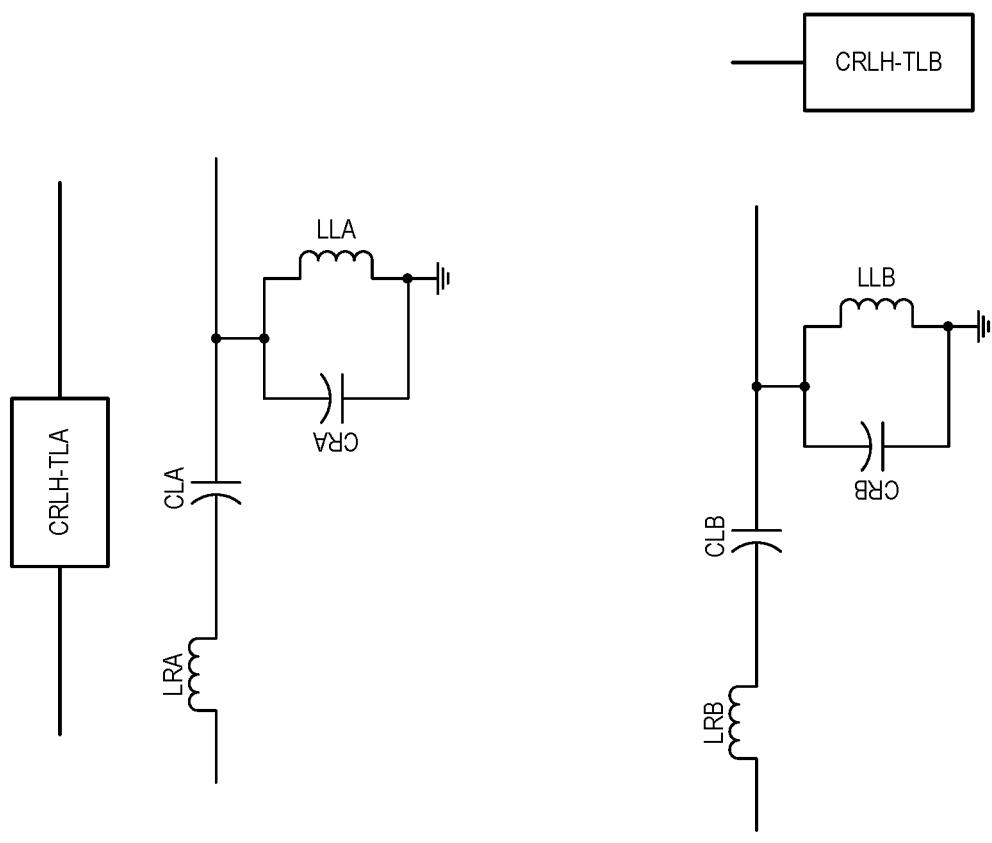
FIG. 17 depicts an example of a solution for matching at two frequencies using the matching network designed with right-left handed transmission lines (CRLH-TLs) shown in FIG. 16.

FIG. 17 depicts an example of a solution for matching at two frequencies using the matching network designed with right-left handed transmission lines (CRLH-TLs) shown in FIG. 16.

The CRLH-TL B shown in FIG. 17 can be opened ended or short-circuited. In an alternate implementation, the topology of FIG. 17 can be slightly modified for similar results. The CLA can be moved to the right of CRA and LLA. In another alternate implementation, the topology of FIG. 17 can be slightly modified for similar results. CLB can moved to the right of CRB and LLB.

For example the CRLH-TL A can be designed to have a frequency $f_1$ with a phase $\Phi_1$ and a frequency $f_2$ with a phase $\Phi_2$. A CRLH-TL can be designed by using for example a series inductor LRA, a shunt capacitor CRA, a series capacitor CLA and a shunt inductor LLA. The CRLH-TL B can have, for example, a series inductor LRB, a shunt capacitor CRB, a series capacitor CLB and a shunt inductor LLB. The impedances of the CRLH-TL A and CRLH-TL B can be defined by:

$$Z_A = \sqrt{\frac{L_{RA}}{C_{RA}}} = \sqrt{\frac{L_{LA}}{C_{LA}}}$$

$$Z_A = \sqrt{\frac{L_{RB}}{C_{RB}}} = \sqrt{\frac{L_{LB}}{C_{LB}}}$$

The series CRLH-TL A can define the real part of the impedance and the shunt CRLH-TL B can define the imaginary part. It is also possible to design variable impedances by replacing the fixed components LRA, CRA, LLA, CLA and LRB, CRB, LLB, CLB by variable/tunable capacitors and variable/tunable inductors. Therefore, the impedances can be changed accordingly to the frequency of operation. For example these variable impedances can be inserted at the input and output of the LDA, between the LNA output and the LDA input. A variable matching can be inserted at the output of the repetition frequency. Or in order to have a variable/tunable LDA, it is possible to tune the oscillation frequency to different values by replacing the fixed values of the inductor and the capacitor by variable ones.

Different implementations are possible. For example, it is possible to have a fixed CRLH-TL A with a variable CRLH-TL B. In another example, it is possible to have a variable CRLH-TL A with a fixed CRLH-TL B. In yet another example, it is possible to have a variable CRLH-TL A and a variable CRLH-TL B.

Figure 18:
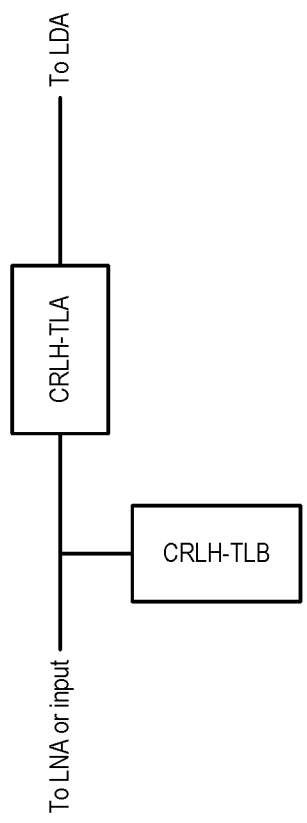
FIG. 18 depicts one potential implementation of CRLH-TLs.

FIG. 18 depicts one potential implementation of CRLH-TLs. The series branch CRLH-TLA is FIG. 18 is connected to the LDA and a parallel CRLH-TLB is connected to LNA/input and branch left open at the bottom where the topology of FIG. 17 was modified such as CLA is moved to the right of CRA (toward LDA).

Figure 19:
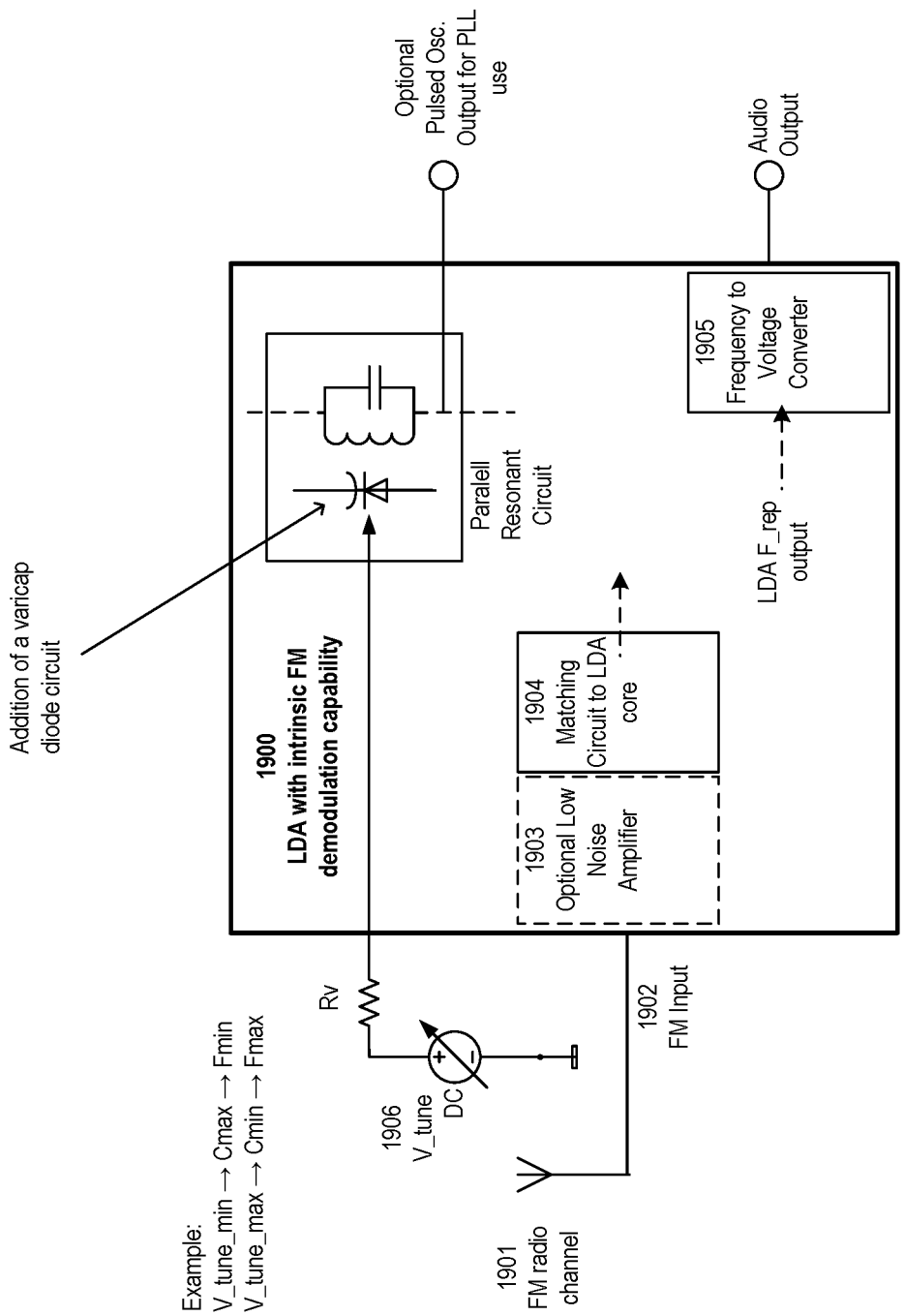
FIG. 19 depicts an example of an LDA as a high sensitivity FM radio receiver and demodulator.

FIG. 19 depicts an example of an LDA 1900 as a high sensitivity FM radio receiver and demodulator. In this embodiment, the FM-LDA can be used as RF front end for a FM radio. The FM radio channel antenna 1901 can feed directly the LDA input 1902. An optional LNA 1903 and matching circuit 1904 can be used to increase the sensitivity and reduce the leaking though the input port. The demodulated audio output can be obtained by converting the LDA output repetition rate into a voltage with a FVC 1905 either analog or digitally. The FM channel is selected with the DC voltage V_tune 1906 applied to the varicap.

This configuration gives a wide band FM demodulation output. Other configurations are possible where narrow band FM can be demodulated (e.g., using a PLL implementation, as discussed below).

Figure 20:
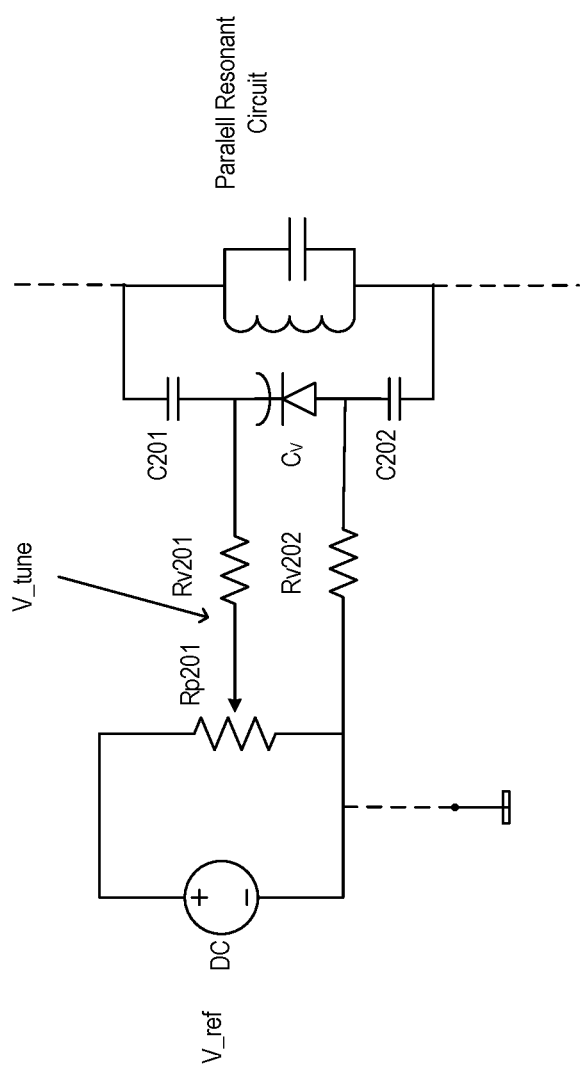
FIG. 20 depicts an example of a varicap circuit implementation for differential- or single-ended tuning voltage with a fixed reference voltage and potentiometer.

FIG. 20 depicts an example of a varicap circuit implementation for differential- or single-ended tuning voltage with a fixed reference voltage and potentiometer Rp1. FIG. 20 shows a possible implementation of a differential- or single-ended control of the varicap. A DC voltage V_tune is applied on the varicap Cv through high impedance Rv201 and Rv202.

In the model of small variations, and assuming that the top node of the parallel resonant circuit is at an AC ground, the total additional capacitance $C_{ADD}$ of the varicap branch is $C_V$ series with C201 and C202, as follows:

$$C_{ADD} = \frac{1}{\frac{1}{C_V} + \frac{1}{C_{201}} + \frac{1}{C_{202}}}$$

The total capacitance, $C_T$, then becomes:

$$C_T = C_{ADD} + C_{RES\_PARAL} + C_{OTHER}$$

In order to maximize the effect of $C_V$ in its branch, C201 and C202 should be greater or much greater than Cv.

The capacitance of $C_{OTHER}$ may be the combination of all other contributions of capacitance seen at the bottom node of parallel resonance circuit. It may include the contribution of an active component's equivalent capacitance (e.g. transistor C_CE//C_CB), the one of the feedback capacitor C81 of FIG. 8, plus parasitic capacitance due the printed circuit, etc. In another implementation the capacitance of the parallel circuit is removed and replaced by the arm of the varicap. In this case, the term $C_{RES\_PARAL}$ is zero in the formulas above.

In this simpler implementation of a FM LDA based receiver, the adjustment of frequency is done manually or mechanically with an adjustable capacitor or inductance. The capacitor of the parallel resonance circuit is replaced by an adjustable capacitor that adjusts the frequency radio channel. Practically, a bunch of fix selectable capacitors may be added to extend and cover the entire frequency bandwidth of 88 MHz to 108 MHz (i.e., a range of frequencies).

In a semi-digital implementation of the previous circuit, the fix capacitance of the parallel resonant circuit may be replaced by two or more fixed capacitors of same or different values and selectable independently, connected in parallel. Since the total capacitance between two nodes is additive when capacitors are added in parallel, a preferred implementation of this circuit will be to use a binary sequence so for instance $C_1=C$, $C_2=2\times C$, $C_3=4\times C$, ..., $C_n=2^N\times C$. With a binary sequence, every capacitance value from value C to value $2^N-1$ can be produced plus zero.

Other sequence of capacitors may be chosen for instance to linearize the output frequency versus the input selection since the output frequency is roughly proportional to the inverse square root of the LC product. In another embodiment, the inductance may be varied instead of or in addition to the capacitors with a sequence that can be binary, decimal or otherwise varied.

In another embodiment, one small-value varicap can be added to a bank or inventory of fixed selectable capacitors. The small-value varicap can be added to increase the adjustment resolution. In yet embodiment, several varicaps can be used in parallel. For example, several capacitors, including at least $C_1$, $C_2$, and $C_3$, can be placed in parallel. One capacitor $C_1$ can have capacitance in a range of about 0.5 C to about 1.5 C; another capacitor $C_2$ can have capacitance in a range of about 1 C to about 3 C; and another capacitor $C_3$ can have capacitance in a range of about 2 C to about 6 C. Additional capacitors can be also be placed in parallel to supplement capacitors $C_1$, $C_2$, and $C_3$. In yet another embodiment, a collection of LC circuit can be switched ON and OFF to change the oscillation frequency of the LDA.

Some LDA implementations can have certain drawbacks. For example, some LDA implementations can have poor selectivity and possible drift with temperature. FIG. 21 depicts an LDA-pulsed oscillator 2104 locked in frequency and phase in a phase lock loop (PLL) 2102 to a precise reference frequency tuned to the desired FM radio channel. The selection of the channel can be controlled by a digital IC, a processor unit or by the end user with a "digital dialer" such as found in the FM car radios.

The pulse oscillations of the LDA 2104 are filtered, amplified and digitized and feeding a frequency divider by N 2103. A phase/frequency comparator compares the signal issued from the N divider and a reference signal. The reference signal can be generated from a local oscillator 2101 such as a digital crystal oscillator divided by a counter M 2106. The phase/frequency comparator 2107 creates a correction voltage proportional to the phase/frequency difference between both input signals. Several types of comparators can be used with various properties namely gain, output range, output impedance and type of output signal (pulse, variable voltage, etc.). A low pass filter follows, that determines the loop response of the PLL. The filtered signal Vc(t) feeds the varicap of the parallel resonant circuit of the LDA 2104 as described previously. Effectively the log amp is used as a controlled VCO. The demodulated FM signal is the control voltage Vc(t). To be effective, the loop bandwidth of the PLL 2102 can be adjusted appropriately, in this configuration should be lower than the lowest audio frequency of the FM radio channel, say 50 Hz. The PLL loop bandwidth is affected by the ratio M, the phase comparator gain in rad/s and the VCO gain in MHz/V.

For an adjustment step of 0.1 MHz in the FM radio band of 88.0 MHz to 108.0 MHz, the comparison frequency may be of 0.1 MHz maximum or any modulo value below such as 50 KHz, 25, 20, 10 KHz, etc. In one embodiment, M and N can adjusted for getting this value of 0.1 MHz at the input of the phase comparator. In this case, the ratio N can be set to 10×F_channel in MHz for instance 880 for 88.0 MHz, 881 for 88.1 MHz, ..., 1079 for 107.9 MHz and 1080 for 108.0 MHz.

An optional squelch function 2108 can be added as usually used in FM radio. This can prevent noisy audio content from being passed through when there is no radio channel present. The squelch switch 2108 may be controlled by the audio demodulated RMS value of the LDA audio output voltage. When the RMS value exceeds a given threshold, it is assumed that the LDA is locked onto a radio channel of sufficient level.

Some advantages of this embodiment, as opposed to a standard FM radio receiver, include without limitation:

- No external antenna since the FM signal is received directly in the high impedance parallel resonant circuit of the LDA. This saves a non-negligible amount of assembly and cost since no external antenna is needed. However the RF sensitivity may be limited to the physical size of the later and miss to be high sensitivity if the circuit is put for instance into a car dash board or any non-free space location where there is excess of radio propagation attenuation.
- High selectivity due to PLL and FM-LDA high skirt ratio
- Simple/cheap FM radio front-end circuit
- Small PCB area (e.g., 1 square inch)
- May need as low a one inductance per circuit
- Digital frequency adjustment as current FM radios
- Mid to high sensitivity in the order of −110 dBm
- Car application: Portion of dashboard needs to be non-conductive.
- Integration possible (component or integrated circuit)

It should be noted that two demodulated audio outputs are possible. One possible output is a narrow band FM (or phase) with the control voltage of the VCO (i.e., Vc(t)). Another possible output is a wide band FM with the regular LDA pulse frequency output that is converted to voltage with a simple frequency-to-voltage converter.

FIG. 22 depicts an embodiment of an LDA-based FM radio receiver with digital channel tuning with antenna. This embodiment is similar to the previous one depicted in FIG. 21, with at least the following differences. First, the embodiment depicted in FIG. 22 can provide very high sensitivity due to its inclusion of an antenna 2210, a LNA 2209 and a regenerative LDA 2204. Second, a suitable antenna is a roughly omnidirectional small (e.g., 2 square inch) antenna 2210 that can be printed on the same printed circuit board embedding the magnetic H (loop) and electrical field E (monopole/dipole) reception for best coupling and penetration through partition such as a car dashboard. A very suitable and preferred printed antenna for this use is a CPL antenna that maximize both the H and E field due to its geometry.

An LDA based FM radio receiver with the features described herein can be built for digital radio, satellite radio, and the like. Similar types of topologies can be used for satellite radios and digital radios.

An LDA can be used in a FM receiver, an AM receiver, or a combined FM and AM receiver and demodulator. One advantage for the LDA receiver with FM demodulation is that it can demodulate FM, AM or both simultaneously. This provides a gain of a few dB versus conventional discriminators. Another advantage is the high skirt ration of the LDA that provides superior selectivity. For instance in the case of FM radio, a high skirt ratio can permit better audio quality when listening to a weak signal while a strong one is very close (e.g., it has the ability to discriminate both the strong and the week signal).

FIG. 23 depicts a high-sensitivity, low-noise amplifier replacement based on FM-LDA and PLL for FSK or frequency hopping spread spectrum FH-SS modulations. This embodiment can target intrinsic demodulation of digital FM signals and digital FM FH-SS.

The LDA 2304 in FM mode can demodulate intrinsically the FSK input 2310 modulation with a high sensitivity. Adding the LDA in a PLL 2302 can increase the selectivity with a higher skirt ratio, increase the interference rejection and permit to select precisely the narrow band or wide channel desired. This is a direct demodulation to BB or low IF and there is no super-heterodyne stage here. The input noise bandwidth may cover the entire frequency band (more than the channel BW) or oppositely only one particular channel. However in both cases the regeneration factor may increase the signal-to-noise ratio.

The output may be selected from one of the following and depending of the application:

- F_Data_out: That output is the repetition frequency output also called F_rep. Each bit of data is provided as an instantaneous frequency (to be exact one over the instantaneous period of F_rep pulse to pulse). The output is quasi-digital and noise insensible! It can effectively be sent to long cable if needed without noise problem. Also since the data is in the frequency domain, there is no need of costly, power hungry fast ADC. Data can be extracted with the circuit discussed previously with respect to FIGS. 10 and 11 and data(k) delivered.
- Data_out(t): Data is already converted in baseband frequency (0 Hz to Fmax). The Data_out(t) output voltage can be slightly processed with limited signal shaping or de-emphasizing if previously emphasized.
- NB FM data_out(t): This is a narrow band (NB) FM voltage output that also happens to be the control voltage for the VCO of the PLL for which the value corresponds to the phase correction or narrow band FM for the PLL to attempt to follow the input signal. The bandwidth of the PLL should be set correctly (usually lower than the data rate) for the system to behave correctly.

In another embodiment, and for further reducing the input noise bandwidth, a set of selectable parallel and series resonators can be added to the LDA. When implemented in an integrated circuit, the added complexity may not be a relevant factor anymore.

In a further embodiment, the circuit can be used for amplification and demodulation of one or more frequency modulated signal(s) issued from one or more sensor(s). Typical applications may cover sensor such as crystal resonator oscillating at a frequency function of the temperature or other physical parameters. The input may be wireless or wired. Some impedance matching or polarization/bias network may be used to interface the one or more sensor(s) and the FM-LDA. Other sensors may include piezoelectric sensors, accelerometers, even array of sensors. Modulation may include frequency chirping or sweeping. In yet another embodiment, if the selectivity is of paramount importance, a super-heterodyne stage can be added in the input such as shown in FIGS. 24A and 24B. FIG. 24A depicts an embodiment of a high-sensitivity, low-noise amplifier based on FM-LDA for FSK or FH-SS modulations with super-heterodyne topology.

FIGS. 24A and 24B depicts an embodiment of a LNA replacement for a FSK receiver 2401 based on FM LDA and super heterodyne reception. At the circuit level, the advantage of the super heterodyne topology may be to generate a fix input frequency that permits to apply a high order filter and therefore gaining a high selectivity. Also the following circuits in the receive chain are treating a signal at a fix frequency whatever the channel selected since the variable channel frequency called RF in FIG. 24A, is selected by a variable frequency on LO1 such as the mixer output 2402 provides an intermediate frequency IF that is equal to difference of the frequency of RF minus the one of LO1 amongst other terms that are generally filtered out. In another words, LO1 is selected by the receiver such as to select one channel amongst N channels in RF frequency and down-convert it in frequency to and intermediate fix frequency IF regardless of the channel selected. The LDA being intrinsically a narrow band amplifier and regenerative device, it filters-out the frequency components outside of his frequency bandwidth of operation with a high order of filtering. It exhibits the functionality of an active band pass filter with high order of filtering on both the high cutting frequency and low cutting frequency sides. One application of the LDA is providing more range, more signal-to-noise ratio, more dynamic range and more interference rejection as a component or sub-system replacement. If the LDA solution is integrated in an integrated circuit or a small module such as done currently for VCO modules in the industry, it may be a high performance drop-in replacement for a RF low noise amplifier LNA in a number of FM/FSK/FH-SS receivers. The value would be to increase the performance without completely redesigning the receiver but replacing one component.

In the embodiment of FIG. 24B, a standard RF LNA can be replaced by a circuit based on the LDA with FM demodulation. A number of advantages can be derived by making such a replacement, including without limitation:

higher sensitivity (recover very weak signals),
higher selectivity due to high skirt ratio (reject close and far frequency interferences),
higher dynamic range (weak to strong signal),
lower noise bandwidth (does not amplify an entire frequency band as a usual LNA),
higher rejection of interferences,
higher rejection of saturation due to mid-strong interferences outside of the frequency band of use.

This embodiment has also superior performance versus a classic super-heterodyne receiver, mainly the higher sensitivity, the higher dynamic range, the higher rejection of strong interferences, and the higher selectivity due to the high skirt ratio. This embodiment can be used for FM narrow or wideband modulation, digital FSK or FM based FH-SS.

If the RF input signal is on a fix FM band, local oscillators LO1 and LO2 can fixed. If the signal is in a channel in a frequency band (i.e., a range of frequencies), local oscillators LO1 and LO2 can be adjustable. If the input signal is digital FM and frequency hopping spread spectrum, LO1 and LO2 can be agile and change their frequency and follow the input RF signal as it hopes from channel to channel. The super-heterodyne structure and high skirt ratio of the LDA provide a high selectivity and high rejection of interferences. Whereas the LNA can cover the entire frequency band of use, the LDA technologies disclosed herein focus on the selected channel. The performance is therefore superior such as listed above.

The input signal in FIG. 24B is down converted using a mixer 2402 to a fix IF frequency at F_RF–F_LO1. The unwanted component at F_RF+F_LO1 is filtered out by the LDA 2403 that is frequency selective and designed to match the IF frequency with a given bandwidth f_IF+/–BW. The LDA 2403 is regenerating the input signal so provides a high sensitivity even after a mixer 2402. A LNA 2404 can be integral to the LDA 2403 to further improve the sensitivity and increase the isolation to the input port and avoid RF energy to lick out on the input (mixer 2402 and antenna 2401). The output frequency repetition of the LDA 2403 may be at least 1 to 2 times faster than the highest data input. 2 scenarios may appear: First, the LDA is not synchronized with the symbol rate of the input data and in order to respect the Nyquist criteria, the output frequency F_rep should be at least twice higher than the highest input data rate. 2) Second, the LDA is synchronized with the symbol rate of the input data and in this case the output frequency F_rep may be at least once the highest input data rate because what may really count is the rate of change of F_rep that should be twice or more the one of the input data. Finally it is mixed (up converted) back to RF with another mixer 2406 and LO2 at the output RF frequency.

It should be noted that the output signal could contain an image at F_RF–2×F_rep. In most cases the following receiving stages may reject anyway signal out of the frequency channel therefore this may not cause any trouble. If needed, an image rejection mixer may be used to cancel the image at F_RF–2×F_rep.

FIG. 25 depicts an example of a FM-LDA LNA replacement. An LNA 2501 can have an RF input 2502, a RF output 2503, one or more voltage supply 2507, and ground connections 2504. Additionally, it may have a connection the receiver reference frequency 2505 in order to be phase coherent. Also if there is more than one channel in the selected frequency band, a channel input information 2506 can be provided. It may be a digital word for instance the number 913 for 913 MHz. This number can be coded in binary "1110010001", hexadecimal "391" or other.

FIG. 26 depicts another embodiment of an LNA replacement for an FSK receiver based on LDA in FM mode and PLL. This implementation is similar to embodiment depicted in FIG. 24B, but is simpler in some ways. When compared to a RF LNA, the embodiment depicted in FIG. 26 can have a higher sensitivity, higher discrimination, and higher interference rejection. There is no heterodyning so the LDA 2601 may cover the entire frequency band of use, is wide band, and may be set to the correct channel with the use of a PLL 2602 locked to the reference local oscillator 2603. The input noise bandwidth can be larger since it may contain the entire frequency band of use in which the channel is to be selected. As a consequence the receive sensitivity may be reduced; however since it is a regenerative system, it is not obvious to determine what may be the impact if any.

FIG. 27 depicts an embodiment of a FM-LDA based FSK repeater. The implementation of such wireless repeater is similar to the LNA replacement. However, several differences are possible. One difference may be that the output image may not be or not well rejected since very close in frequency to the output RF of the mixer 2706 so the output mixer 2706 may be replaced by an image rejection mixer. An optional power amplifier 2707 and bandpass filter 2708 may be added and finally feeding a re-emitting antenna 2709. Analog repeater requires that the retransmission frequency being at another channel otherwise the system may interfere itself and may oscillate. To retransmit in the same frequency some intelligence and memory may be used and the signal can be retransmitted not at the same time as the receive signal with time division multiple access TDMA or carrier sense multiple access with collision avoidance CSMA/CA protocols.

Another benefit of the a FM LDA versus a classic FM detector is that simultaneous demodulation of FM and AM can bring an addition of about 4 dB or more of demodulated baseband volume. The LDA may demodulate the FM modulation and exhibit a repetition rate in an IF frequency that holds the information of amplitude and phase for which the instantaneous frequency variation of the pulse to pulse correspond to the input signal v(t). The signal can be extracted by feeding a FVC and getting V_out(t) or applying a digital FVC. The repetitive output pulse signal is insensible to noise since the info is FM modulated. This may benefit applications where transmission of a signal over a noisy environment or over a long line is needed.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In general, the various features and processes described above may be used independently of one another, or may be combined in different ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. The example systems and components described herein may be configured differently than described. For example, elements may be added to, removed from, or rearranged compared to the disclosed examples.

While certain example or illustrative examples have been described, these examples have been presented by way of example only, and are not intended to limit the scope of the subject matter disclosed herein. Indeed, the novel methods and systems described herein may be embodied in a variety of other forms. The accompanying claims and their equivalents are intended to cover such forms or modifications as would fall within the scope and spirit of certain of the subject matter disclosed herein.

What is claimed is:

1. A system for use in a FM receiver in a super-heterodyne topology, the system comprising:
   a logarithmic detector amplifier (LDA) having a time variant input impedance and being configured to generate an oscillation based on a first intermediate signal received at an input port, determine modulation information from the oscillation, and generate a second intermediate signal at a second predetermined frequency;
   a matching circuit serially connected to an isolator at the input port wherein the matching circuit is configured to control different impedances at different frequencies and wherein the matching circuit is implemented as a fixed matched conjugate at a specific impedance value of the time variant input impedance wherein the specific impedance value is a mean value of the time variant input impedance;
   a first mixer configured to receive a radio frequency (RF) input signal at an input frequency and to convert the RF input signal to the first intermediate signal at the first predetermined frequency, wherein the input frequency is within a range of frequencies; and
   a first variable oscillator configured to provide the first mixer with an indication of a difference between the input frequency and the first predetermined frequency.

2. The system of claim 1, wherein the RF input signal comprises at least one of an FM radio signal, a digital FM radio signal, an analog FM signal, a frequency-shift keying (FSK) signal, a Gaussian frequency-shift keying (GFSK) signal, an HD radio signal, a satellite radio signal, a minimum-shift keying (MSK) signal, a Gaussian minimum shift keying (GMSK) signal, or a n-ary digital FM signal.

3. The system of claim 1, wherein the isolator comprises a low noise amplifier configured to insulate the first intermediate signal between the input port and the matching circuit.

4. The system of claim 1, the system further comprising a frequency reference source configured to provide a reference frequency to the first variable oscillator.

5. The system of claim 1, the system further comprising a controller configured to provide a reference frequency to the first variable oscillator.

6. The system of claim 1, the system further comprising one or more of an analog voltage to frequency converter, a digital voltage to frequency converter, or an analog FM detector.

7. The system of claim 1, wherein the input RF signal comprises at least one of a wired FM signal, a wireless FM signal, an analog FM signal, or a digital FM signal.

8. The system of claim 1, wherein the matching circuit comprises one or more composite right-left handed transmission lines (CRLH-TLs) configured to match impedances at one or more frequencies.

9. The system of claim 1, further comprising an additional matching circuit wherein the isolator is interposed between the matching circuit and the additional matching circuit.

10. The system of claim 1, further including:
    a second mixer configured to convert the second intermediate signal at the second predetermined frequency to an output RF signal having an output frequency, the output frequency being within the range of frequencies; and
    a second variable oscillator configured to provide the second mixer with an indication of a difference between the output frequency and the second predetermined frequency.

11. The system of claim 10, the system further comprising a controller configured to provide a reference frequency to the second variable oscillator.

12. The system of claim 10, the system further comprising a frequency reference source configured to provide a reference frequency to the second variable oscillator.

13. The system of claim 12, wherein the system operates as a repeater such that the output RF signal repeats information in the input RF signal, wherein the output RF signal is amplified from the input RF signal.

14. The system of claim 13, wherein the input frequency is the same as the output frequency, and wherein the second mixer is configured to output a complete message via the output signal after the complete message has been received by the first mixer via the input signal.

15. The system of claim 13, wherein the input frequency is different from the output frequency.

16. The system of claim 15, further comprising:
a filter coupled to the second mixer, the filter configured to filter particular frequency components from the output signal.

17. The system of claim 16, further comprising:
an amplifier coupled to the filter, the amplifier configured to amplify the filtered output signal.

18. A system for use in a FM receiver in a super-heterodyne topology, the system comprising:
a logarithmic detector amplifier (LDA) having an input port configured to receive a first intermediate signal at a first predetermined frequency, the LDA configured to generate an oscillation based on the first intermediate signal, determine modulation information from the oscillation, and generate a second intermediate signal at a second predetermined frequency,
the LDA including a matching circuit and an isolator at the input port wherein the matching circuit is configured to control different impedances at different frequencies and wherein the matching circuit and the isolator reduce leaking through the input port of the LDA and improve regeneration and gain of the LDA;
a first mixer configured to receive a radio frequency (RF) input signal at an input frequency and to convert the RF input signal to the first intermediate signal at the first predetermined frequency, wherein the input frequency is within a range of frequencies; and
a first variable oscillator configured to provide the first mixer with an indication of a difference between the input frequency and the first predetermined frequency;
a controller configured to provide a reference frequency to the first variable oscillator;
a phase lock loop (PLL) in a closed loop configuration and configured to operate as a voltage-controlled oscillator (VCO), wherein the controller is configured to provide the reference frequency to the PLL and wherein the LDA is locked in frequency and phase in the PLL to the reference frequency.

19. The system of claim 18, wherein an N divider of the PLL is configured to adjust the frequency of the input RF signal, and wherein an output of the LDA is connected to the N divider of the PLL.

20. A system for use in a FM receiver in a super-heterodyne topology, the system comprising:
a logarithmic detector amplifier (LDA) having a time variant input impedance and being configured to generate an oscillation based on a first intermediate signal received at an input port, determine modulation information from the oscillation, and generate a second intermediate signal at a second predetermined frequency;
a matching circuit serially connected to an isolator at the input port wherein the matching circuit is configured to control different impedances at different frequencies and wherein the matching circuit is implemented as a fixed matched conjugate at a specific impedance value of the time variant input impedance wherein the specific impedance value is an impedance value of the time variant input impedance at a maximum oscillation amplitude level;
a first mixer configured to receive a radio frequency (RF) input signal at an input frequency and to convert the RF input signal to the first intermediate signal at the first predetermined frequency, wherein the input frequency is within a range of frequencies; and
a first variable oscillator configured to provide the first mixer with an indication of a difference between the input frequency and the first predetermined frequency.

21. A system for use in a FM receiver in a super-heterodyne topology, the system comprising:
a logarithmic detector amplifier (LDA) having a time variant input impedance and being configured to generate an oscillation based on a first intermediate signal received at an input port, determine modulation information from the oscillation, and generate a second intermediate signal at a second predetermined frequency;
a matching circuit serially connected to an isolator at the input port wherein the matching circuit is configured to control different impedances at different frequencies and wherein the matching circuit is implemented as a fixed matched conjugate at a specific impedance value of the time variant input impedance wherein the specific impedance value is an impedance value of the time variant input impedance corresponding to a most interesting behavior point of the LDA at which there exists signal buildup from noise;
a first mixer configured to receive a radio frequency (RF) input signal at an input frequency and to convert the RF input signal to the first intermediate signal at the first predetermined frequency, wherein the input frequency is within a range of frequencies; and
a first variable oscillator configured to provide the first mixer with an indication of a difference between the input frequency and the first predetermined frequency.

* * * * *